(12) United States Patent
Han et al.

(10) Patent No.: US 12,037,434 B2
(45) Date of Patent: Jul. 16, 2024

(54) CHEMICAL COMPOSITIONS AND METHODS OF PATTERNING MICROELECTRONIC DEVICE STRUCTURES

(71) Applicant: Intel Corporation, Santa Clara, CA (US)

(72) Inventors: Eungnak Han, Portland, OR (US);
Gurpreet Singh, Portland, OR (US);
Tayseer Mahdi, Hillsboro, OR (US);
Florian Gstrein, Portland, OR (US);
Lauren Doyle, Portland, OR (US);
Marie Krysak, Portland, OR (US);
James Blackwell, Portland, OR (US);
Robert Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 307 days.

(21) Appl. No.: 17/313,932

(22) Filed: May 6, 2021

(65) Prior Publication Data

US 2021/0371566 A1 Dec. 2, 2021

Related U.S. Application Data

(60) Provisional application No. 63/033,721, filed on Jun. 2, 2020.

(51) Int. Cl.
| | |
|---|---|
| *C08F 265/04* | (2006.01) |
| *C08F 265/02* | (2006.01) |
| *G03F 7/11* | (2006.01) |
| *H01L 23/522* | (2006.01) |
| *H01L 23/528* | (2006.01) |

(52) U.S. Cl.
CPC .......... *C08F 265/04* (2013.01); *C08F 265/02* (2013.01); *G03F 7/11* (2013.01); *H01L 23/5226* (2013.01); *H01L 23/528* (2013.01)

(58) Field of Classification Search
CPC ............................ C08F 265/04; C08F 265/02
See application file for complete search history.

(56) References Cited

U.S. PATENT DOCUMENTS

| | | | | |
|---|---|---|---|---|
| 2004/0030019 | A1* | 2/2004 | Kim | .......................... C08K 3/22 524/431 |
| 2012/0116007 | A1* | 5/2012 | Gopalan | ................. G03F 7/165 524/529 |
| 2017/0037178 | A1* | 2/2017 | Thackeray | ............ G03F 7/0392 |

OTHER PUBLICATIONS

Wu et al. Adv. Funct. Mater. 2001, 11, 271-276 (Year: 2001).*

* cited by examiner

*Primary Examiner* — Mark S Kaucher
(74) *Attorney, Agent, or Firm* — Essential Patents Group, LLP

(57) ABSTRACT

A chemical composition includes a polymer chain having a surface anchoring group at a terminus of the polymer chain. The surface anchoring group is metal or dielectric selective and the polymer chain further includes at least one of a photo-acid generator, quencher, or a catalyst. In some embodiments, the surface anchoring group is metal selective or dielectric selective. In some embodiments, the polymer chain includes side polymer chains where the side polymer chains include polymers of photo-acid generators, quencher, or catalyst.

6 Claims, 15 Drawing Sheets

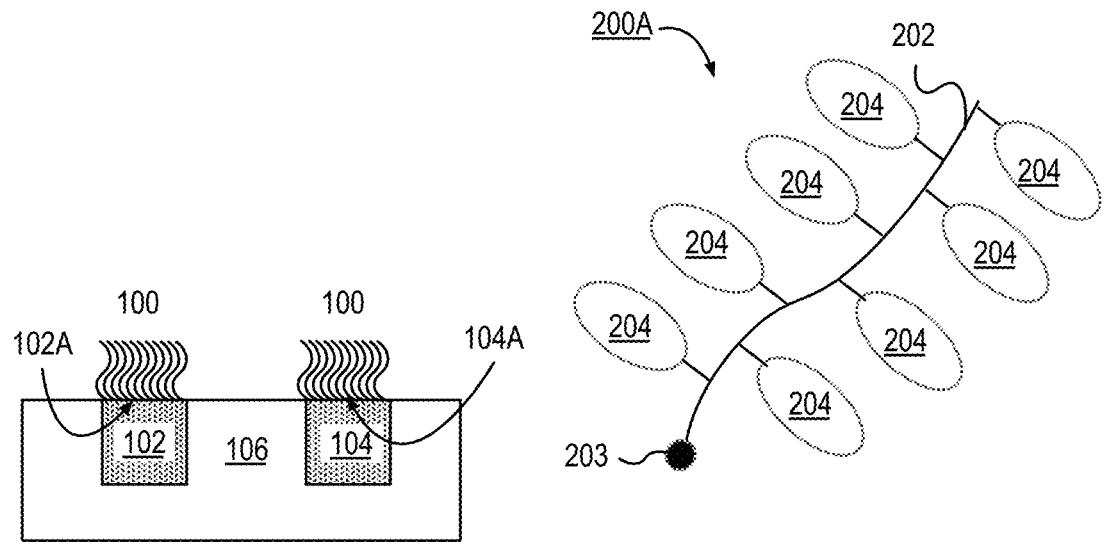
FIG. 1
FIG. 2A
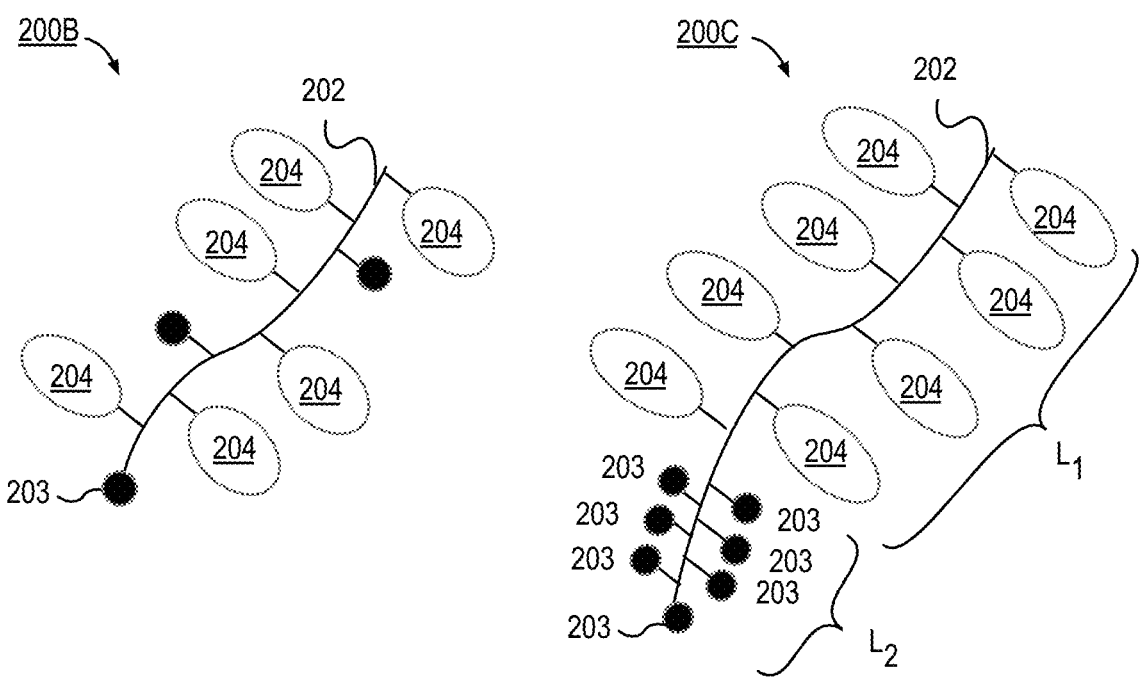
FIG. 2B
FIG. 2C

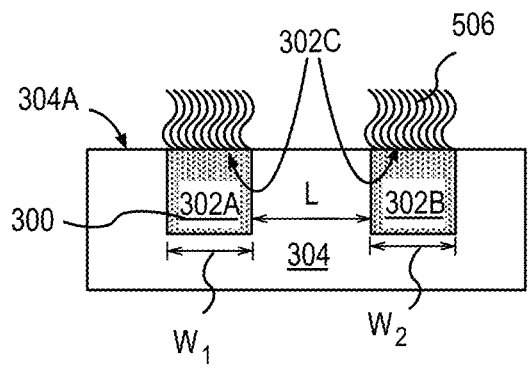
FIG. 5A
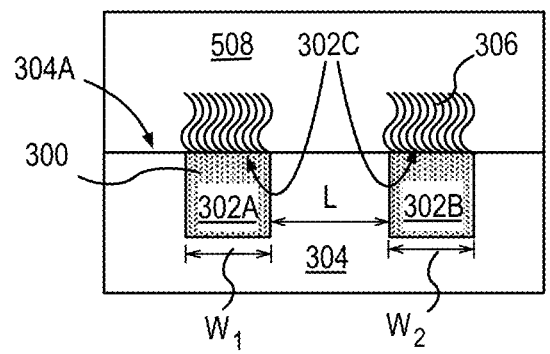
FIG. 5B
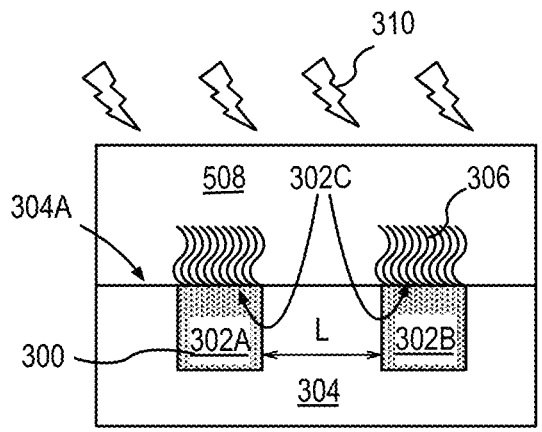
FIG. 5C
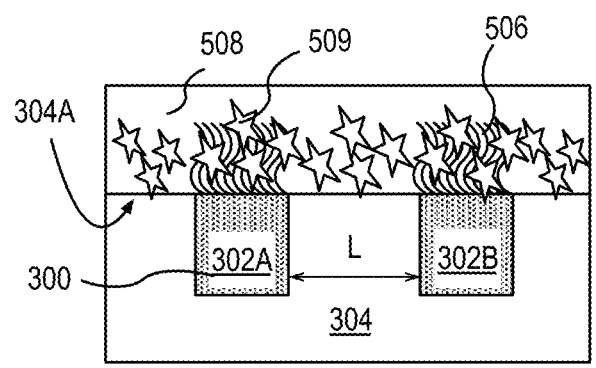
FIG. 5D
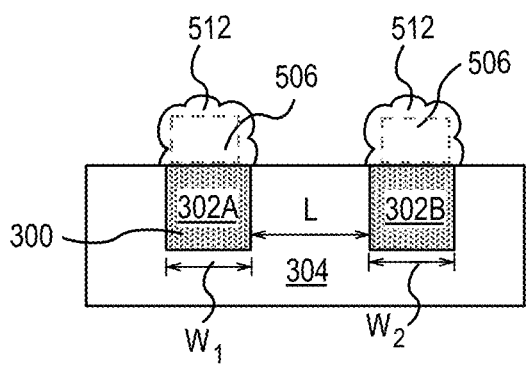
FIG. 5E
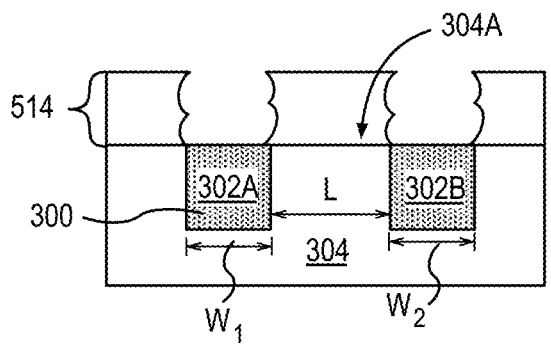
FIG. 6
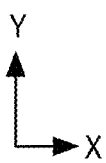

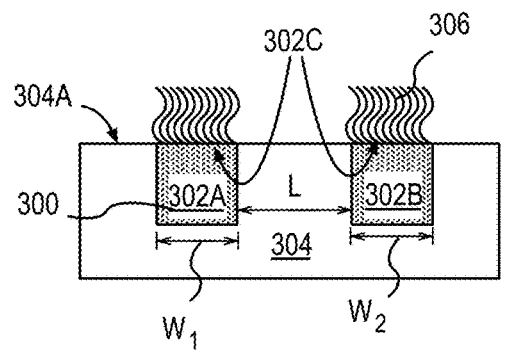
FIG. 7A
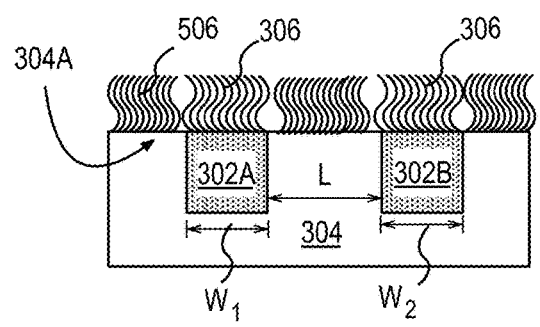
FIG. 7B
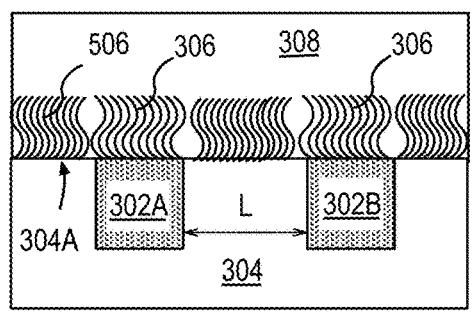
FIG. 7C
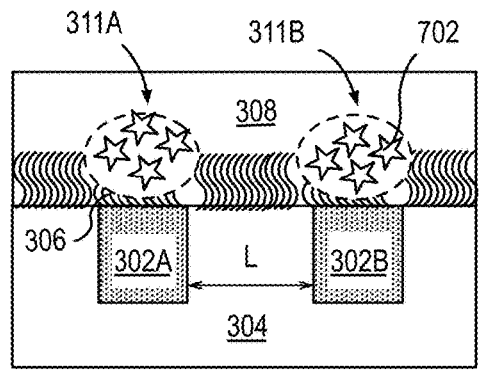
FIG. 7D
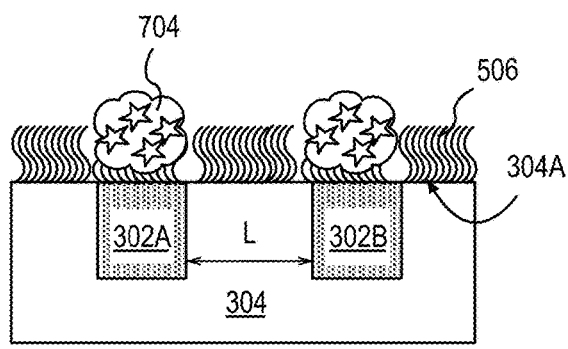
FIG. 7E
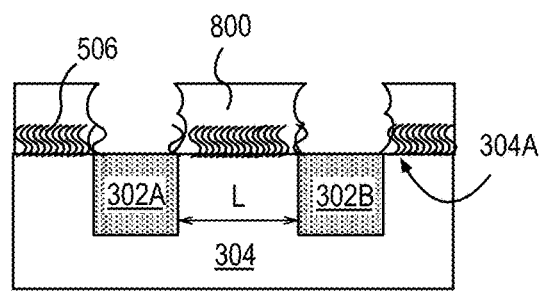
FIG. 8

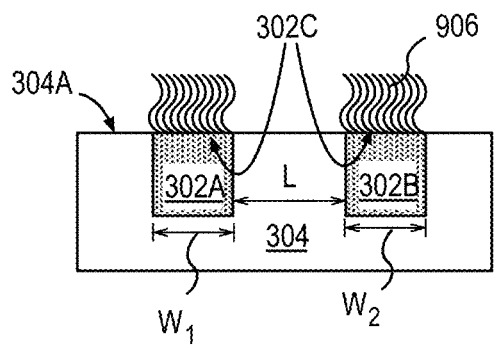
FIG. 9A
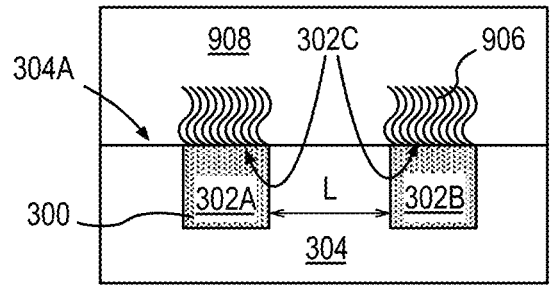
FIG. 9B
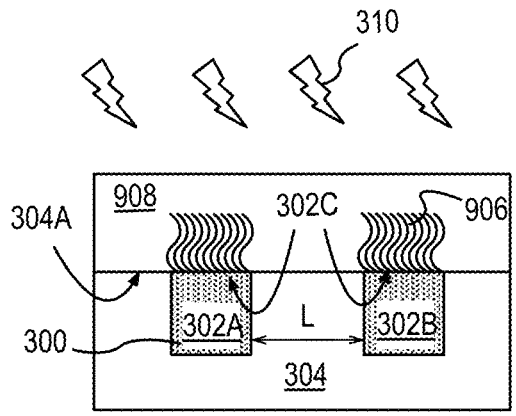
FIG. 9C
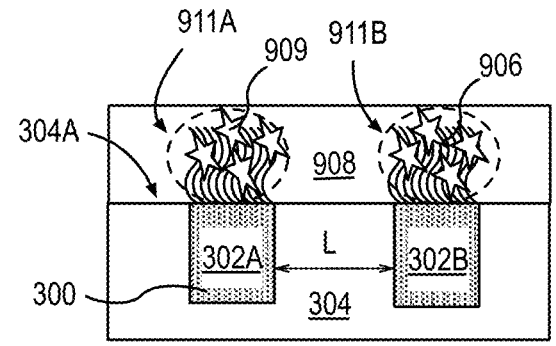
FIG. 9D
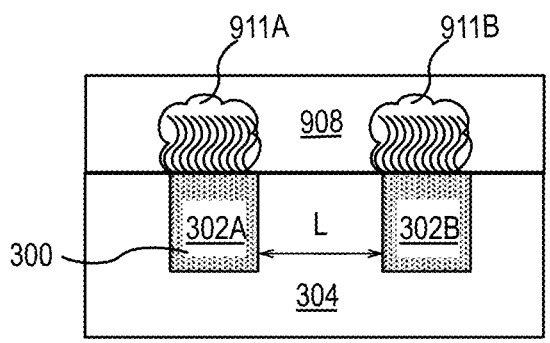
FIG. 9E
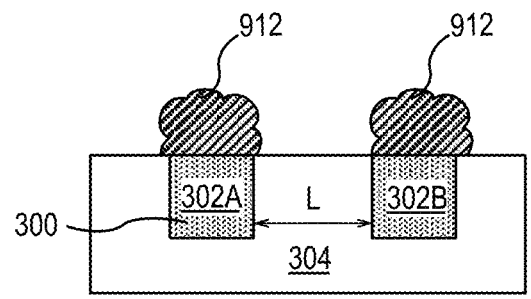
FIG. 9F

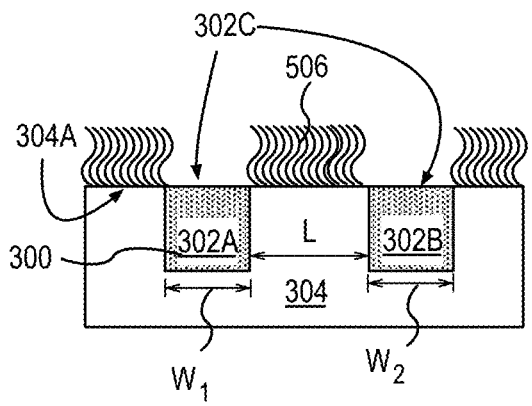
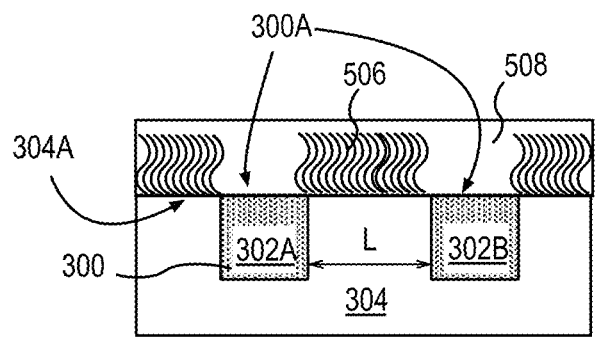
FIG. 10A  FIG. 10B
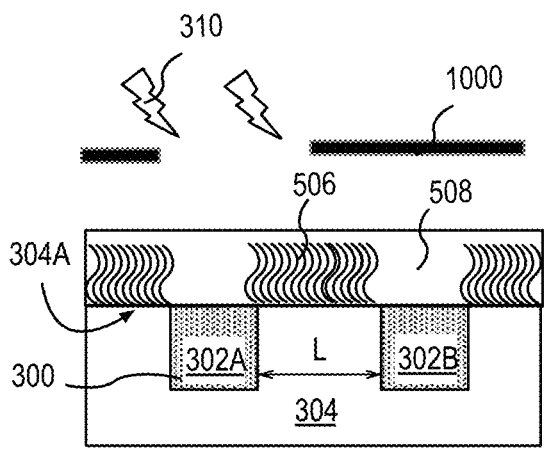
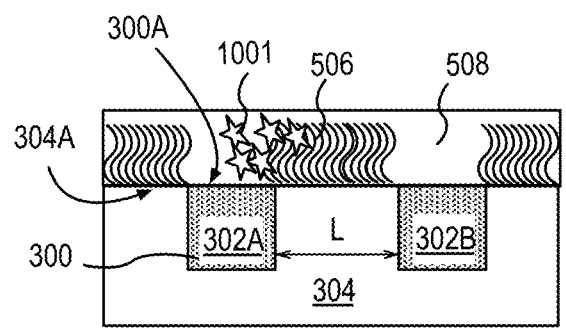
FIG. 10C  FIG. 10D
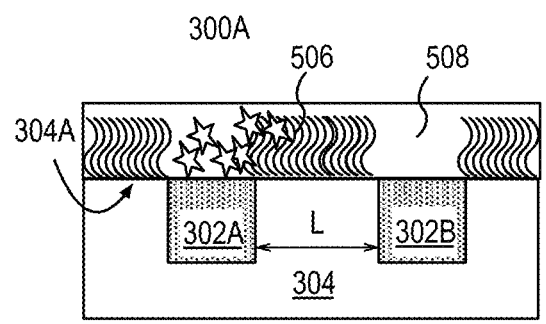
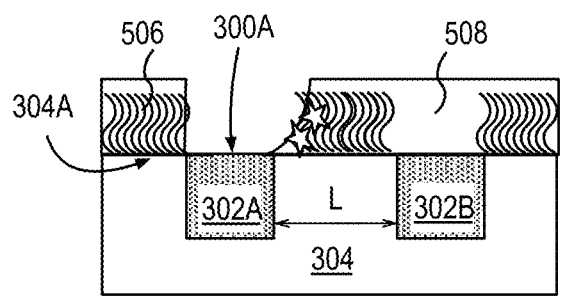
FIG. 10E  FIG. 10F

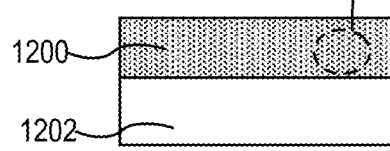
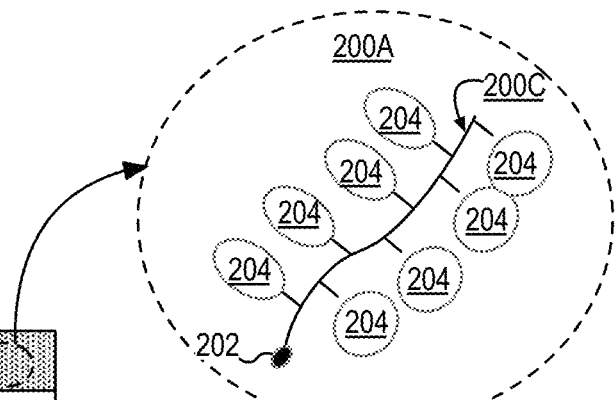
FIG. 12    FIG. 13
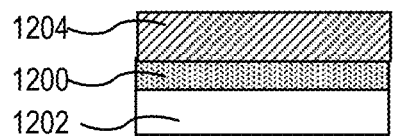
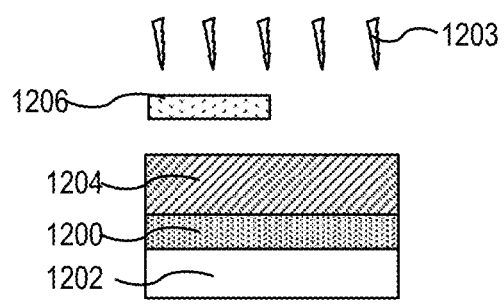
FIG. 14A    FIG. 14B
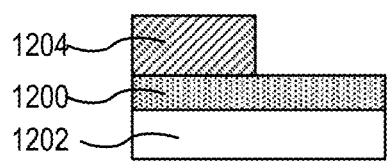
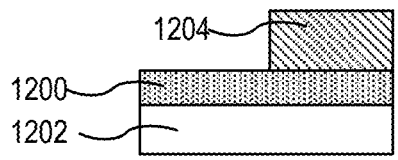
FIG. 14C    FIG. 14D

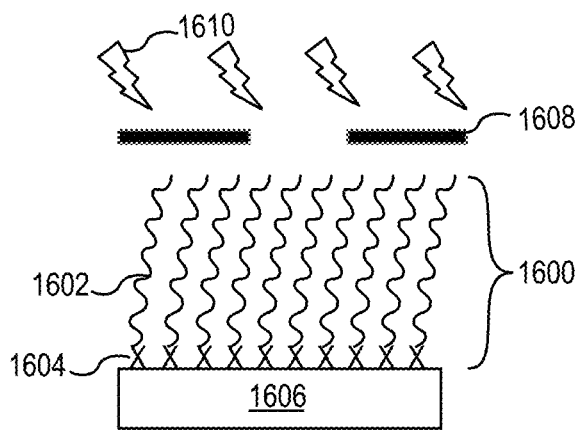
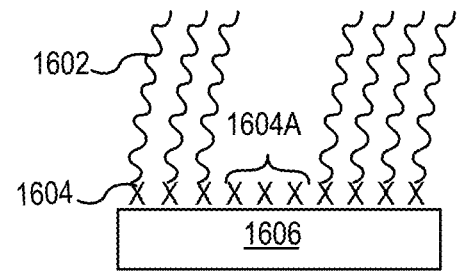
FIG. 16A            FIG. 16B
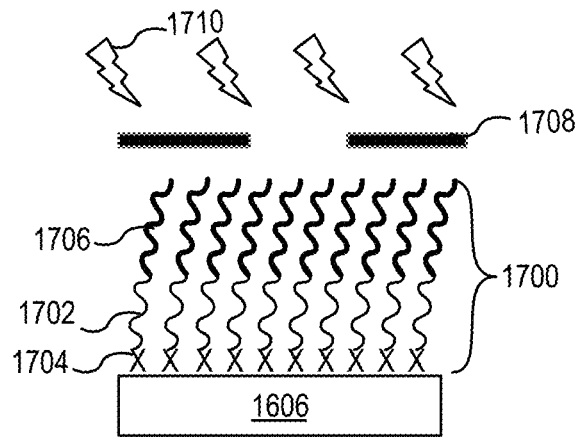
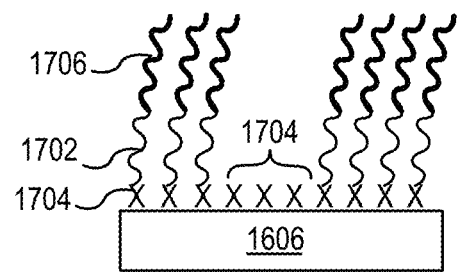
FIG. 17A            FIG. 17B
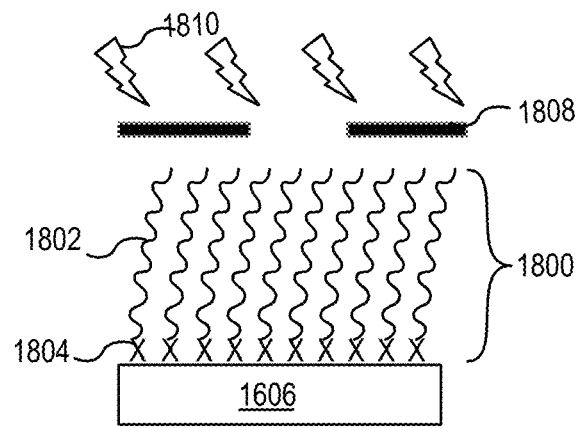
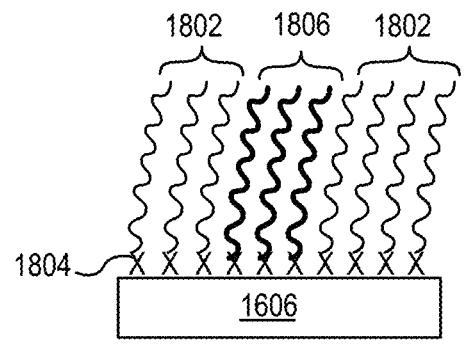
FIG. 18A            FIG. 18B

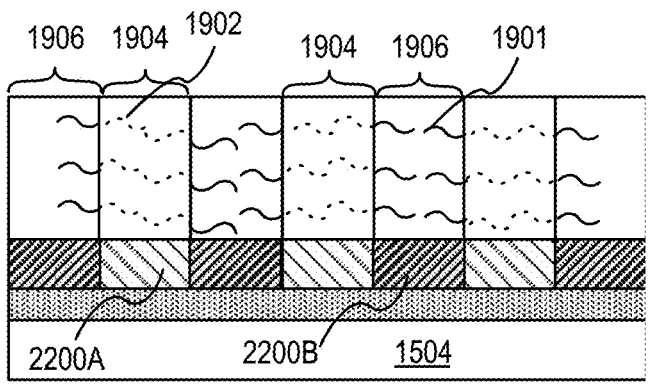 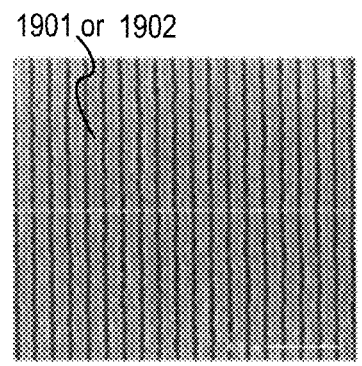
FIG. 22A　　　　　　　FIG. 22B
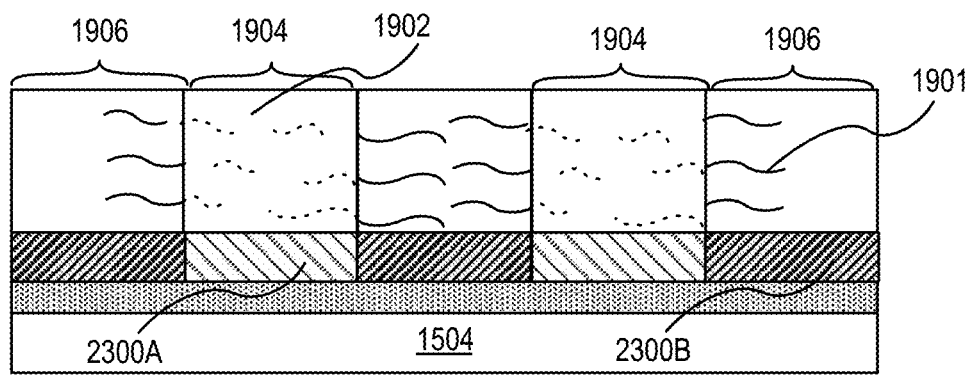
FIG. 23A
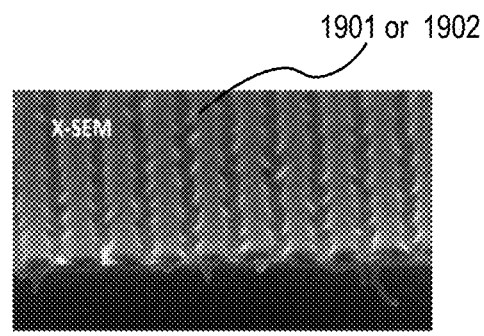
FIG. 23B

CHEMICAL COMPOSITIONS AND METHODS OF PATTERNING MICROELECTRONIC DEVICE STRUCTURES

CLAIM OF PRIORITY

This application claims priority to Provisional Patent Application No. 63/033,721 filed on Jun. 2, 2020 and titled "CHEMICAL COMPOSITIONS & METHODS OF PATTERNING MICROELECTRONIC DEVICE STRUCTURES," which is incorporated herein by reference in its entirety.

BACKGROUND

To pattern sub 10 nm feature sizes for application to integrated circuits, a variety of patterning techniques, such as EUV lithography (EUVL) and directed self-assembly (DSA) using block copolymer or a combination thereof may be utilized. DSA may be utilized to form features having a uniform size and pitch on any given layer. However, it is advantageous to explore techniques and develop materials that utilize one or more features of DSA patterning and combine them with EUV compatible photoresists. Such techniques may provide features with arbitrary size and pitch as well as improve quality of patterning at sub 10 nm dimension.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 1 is a cross-sectional illustration of surface grafted polymers (surface grafted polymer layer) selectively formed on a metal electrode in accordance with embodiments of the present disclosure.

FIG. 2A is a diagram illustrating a polymer chain including a surface anchoring group and a plurality of polymer side chains on the polymer chain in accordance with some embodiments of the present disclosure.

FIG. 2B is a diagram illustrating a polymer chain including a surface anchoring group and a plurality of polymer side chains on the main chain in accordance with some embodiments of the present disclosure.

FIG. 2C is a diagram illustrating a polymer chain including a surface anchoring group and a plurality of polymer side chains on the main chain in accordance with some embodiments of the present disclosure.

FIG. 5A illustrates the structure of FIG. 3A following the formation of a surface grafted polymer layer selectively on upper most surfaces of the metal.

FIG. 5B illustrates the structure of FIG. 5A following the formation of a quencher free EUV photoresist on a surface grafted polymer layer and on a dielectric.

FIG. 5C illustrates the structure of FIG. 5B during a process of flood exposure on a quencher free EUV photoresist.

FIG. 5D illustrates the structure of FIG. 5C following the process of flood exposure of quencher free EUV photoresist.

FIG. 5E illustrates the structure of FIG. 5D following the process of post exposure bake of the substrate and following the process of developing the quencher free EUV photoresist, in accordance with an embodiment of the present disclosure.

FIG. 6 illustrates the structure of FIG. 5D following the process of developing the quencher free EUV photoresist, in accordance with an embodiment of the present disclosure.

FIG. 7A illustrates the structure of FIG. 3A following the formation of the first surface grafted polymer layer selectively on surfaces of the conducting material.

FIG. 7B illustrates the structure of FIG. 7A following the formation of a second surface grafted polymer layer selectively on surfaces of the dielectric material.

FIG. 7C illustrates the structure of FIG. 7B following the formation of an EUV photoresist on the surface grafted polymer layers.

FIG. 7D illustrates the structure of FIG. 7C following the process of flood exposure on the EUV photoresist and following the process of post exposure bake.

FIG. 7E illustrates the structure of FIG. 7D following the process of developing the EUV photoresist.

FIG. 8 illustrates the structure of FIG. 7D following the process of developing the EUV photoresist.

FIG. 9A illustrates the structure of FIG. 3A following the formation of a catalyze containing surface grafted polymer layer selectively on surfaces of the conducting material.

FIG. 9B illustrates the structure of FIG. 9A following the formation of a cross linkable polymer on the catalyze containing surface grafted polymer layer and on the dielectric.

FIG. 9C illustrates the structure of FIG. 9B during a process of flood exposure of the cross linkable polymer.

FIG. 9D illustrates the structure of FIG. 9C following the process of flood exposure of the cross linkable polymer.

FIG. 9E illustrates the structure of FIG. 9D following the process of post exposure bake of the substrate.

FIG. 9F illustrates the structure of FIG. 9E following the process of developing the cross linkable polymer.

FIG. 10A illustrates the structure of FIG. 3A following the formation of a surface grafted polymer layer selectively on surface of the dielectric material.

FIG. 10B illustrates the structure of FIG. 10A following the formation of EUV photoresist on the surface grafted polymer layer and on the metal features.

FIG. 10C illustrates the structure of FIG. 10B during a process of masked EUV exposure of the quencher free EUV photoresist.

FIG. 10D illustrates the structure of FIG. 10C following the process of masked EUV exposure of the quencher free EUV photoresist.

FIG. 10E illustrates the structure of FIG. 10D following the process of post exposure bake of the EUV photoresist.

FIG. 10F illustrates the structure of FIG. 10E following the process of developing a baked quencher free EUV photoresist.

FIG. 12 is a cross sectional illustration of a surface grafted polymer material formed above a substrate.

FIG. 13 is an enhanced cross-sectional illustration of a polymer chain.

FIG. 14A illustrates the structure of FIG. 12 following the formation of an EUVL compatible photoresist is formed on the surface grafted polymer material.

FIG. 14B illustrates the structure of FIG. 14A following the process of preferentially covering a portion of the EUV compatible photoresist.

FIG. 14C is a cross-sectional illustration of a EUV compatible photoresist having a positive tone that has been exposed.

FIG. 14D is a cross-sectional illustration of a EUV compatible photoresist having a negative tone, that has been exposed, as illustrated in FIG. 14B, and developed.

FIG. 16A is a cross-sectional illustration of a EUV lithography exposure of a direct patternable surface grafted polymer through a mask.

FIG. 16B illustrates the structure of FIG. 16A following the removal of portions of scissioned polymer chain.

FIG. 17A is a cross-sectional illustration of a EUV lithography exposure of a direct patternable surface grafted polymer through a mask.

FIG. 17B illustrates the structure of FIG. 17A following the removal of portions of scissioned polymer chain and attached hydrophobic or a hydrophilic polymer.

FIG. 18A is a cross-sectional illustration of a EUV lithography exposure of a direct patternable surface grafted polymer through a mask.

FIG. 18B illustrates the structure of FIG. 18A following the conversion of portions of polarity switchable polymer chain post EUVL.

FIG. 22A is a cross-sectional illustration of a plurality of domains in a regular BCP patterning scheme.

FIG. 22B is a scanning tunneling microscope image of a patterned BCP design.

FIG. 23A is a cross-sectional illustration of a plurality of domains in a BCP patterning where the chemical linkage between a first block and a second block is intentionally broken.

FIG. 23B is a scanning tunneling microscope image of a patterned BCP design.

DETAILED DESCRIPTION

Figure 3A:
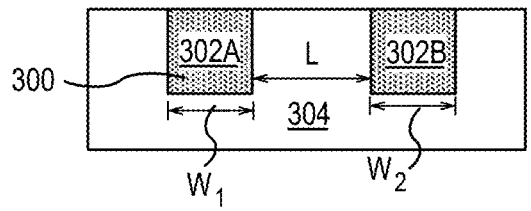
FIG. 3A is a cross-sectional illustration of a plurality of electrodes formed in a dielectric in accordance with an embodiment of the present disclosure.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized, and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that some embodiments may be practiced without these specific details. In some instances, well-known methods and devices are shown in block diagram form, rather than in detail, to avoid obscuring other aspects of an embodiment. Reference throughout this specification to "an embodiment" or "one embodiment" means that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Development of materials for surface grafted polymer layers that are selective to one or more materials of a heterogenous surface and overlaying a EUV compatible resist that can react with the surface grafted polymer to form polymer masks may be advantageous in integrated circuit applications. In one such embodiment, a combination of resist and surface grafted polymer layer can advantageously form polymer masks that are self-aligned to the patterns in the heterogenous surface by flood exposing the resist. Such a process may overcome pitch limitation of traditional block copolymer, lend itself to enable pattern replication, and obviate the need to create a mask. In other applications, surface grafted novel polymer layers can be engineered that can undergo chain scission reaction upon EUV photon (or electron) exposure to create feature sizes for DSA applications. Application of bock copolymer on pre-patterned surface grafted polymer layers can help to improve structural integrity of polymer masks. In another embodiment, engineering a pseudo-BCP that behaves like regular BCP for self-assembly can be advantageous. Breaking the linkage between two polymers in pseudo-BCP using chemical, optical or thermal methods can lead to formation of feature with dimensions that are not limited by molecular weight of the BCP polymers.

In accordance with some embodiments herein, functional polymer that can selectively graft for selective formation on either a metallic or a dielectric surface is described. A polymer brush is the name given to a surface coating of polymers that are tethered to a surface. Functionalization of the surface grafting polymer provides the polymer molecule with specific functionality. In one embodiment, a photo-acid generator (PAG) containing surface grafting polymer is applied on a metallic surface. The PAG containing surface grafting polymer once surface grafted by an anchor group, can be induced to locally release an acid to trigger solubility change of a photoresist material in contact with the PAG containing surface grafting polymer. Such a photoresist may be an EUV photoresist material, for example that has been applied over the PAG-containing surface grafting polymer. The resist material may itself include PAG, in which case PAG released from the PAG-containing surface grafted polymer, for example upon its exposure to EUV radiation, locally increases the PAG content of the resist. Alternatively, a resist may be substantially PAG-free in which case the only PAG present in the resist is generated locally to the PAG-containing surface grafting polymer upon dissolution of the PAG from the surface grafted polymer molecule. The surface grafting polymer may have, for example, a chemical composition that includes a polymer chain including at least one surface anchoring group facilitating selective self-assembly of the PAG-containing surface grafting polymer to a particular portion of a heterogeneous surface of a substrate, such as a microelectronic device structure that includes a pattern (e.g., grating) of metallic and dielectric materials. The surface grafting polymer may further include a plurality of polymer side chains connected to the polymer main chain, at least one of which includes one or more monomer comprising a PAG molecule.

In other examples, a catalyst-containing surface grafting polymer is selectively applied to a metallic surface. In some such examples, the catalyst containing surface grafting polymer may be surface grafted and can locally release acid to trigger solubility change of a cross linkable polymer to be subsequently applied on the surface grafted polymer.

FIG. 1 is a cross-sectional illustration of surface grafted polymer layer 100 selectively formed on a surface of a pair of metal features 102 and 104 in accordance with embodiments of the present disclosure. As illustrated surface grafted polymer layer 100 is substantially confined to an uppermost surface 102A of the metal feature 102 and to an uppermost surface 104A of the metal feature 104 and is substantially absent from a surface of a dielectric material 106. The surface grafted polymer layer 100 may be a self-assembled monolayer (SAM) molecule that includes at least one surface anchoring group that has a chemically affinity to uppermost surfaces 102A and 104A of metal features 102, 104, respectively. In embodiments, metal features 102 and 104 are elemental metal or a metal alloy. Metal features 102 and 104 may include a same material or dissimilar materials. In embodiments, metal features 102 and 104 include copper, tungsten, nickel, ruthenium, cobalt, aluminum or oxides of cobalt or aluminum. The surface grafted polymer layer 100 may include various chemical compositions, examples of which are illustrated in FIGS. 2A-2C.

FIG. 2A is a diagram illustrating an embodiment of a chemical composition of the surface grafting polymer layer that is illustrated in FIG. 1. As shown, surface grafting polymer molecule 200A includes a polymer chain 202. In an embodiment, polymer molecule 200A includes at least one surface anchoring group 203. Advantageously, surface anchoring group 203 is metal or dielectric selective. Surface anchoring group 203 enables surface grafting polymer molecule 200A to be selectively attached upon a heterogeneous surface comprising multiple materials having differing surface chemistry. In the illustrative embodiment, the polymer chain 202 includes one surface anchoring group 203 that is at a terminus of the polymer chain 202.

The surface anchoring group 203 may be chosen to provide selectivity to a metal, an alloy or a dielectric surface, depending on the application. In embodiments where the surface anchoring group 203 is metal selective, the surface anchoring group 203 includes hydroxyl, amines, phosphines, thiol, thiolate, thioacetate, disulfide, alkyl azide, aryl azide, nitrile, phosphate, silyl, alkyl and other phosphonate ester, phosphonamide, sulfonamides, sulfenate, sulfinate, sulfonate, boronic acid, phosphonic acids, carboxylic acids, phosphorous dichloride, alkenes or alkyne material. Furthermore, derivatives of surface anchoring group 203 where the listed anchoring groups are generated on a substrate surface are also applicable.

In embodiments where the surface anchoring group 203 is selective to a dielectric, the surface anchoring group 203 includes alkoxysilanes, aminosilanes, or chlorosilanes, or mono-, di- and tri-substituted groups of alkoxysilanes, aminosilanes, or chlorosilanes. Furthermore, derivatives of these anchoring groups where the listed anchoring groups are generated on the substrate surface are also applicable.

In an embodiment, polymer chain 202 and/or side polymer chains attached to polymer chain 202 may include one or more functionalized monomers 204 including a chemical that amplifies or quenches reactions in a photoresist. A polymer chain 202 and/or side polymer chains chain includes, for example, a photo-acid generator, a base quencher, or a crosslinking catalyst, in accordance with some embodiments.

In the illustrative embodiment, a polymer chain 202 includes repeat units that include at least one of a photo-acid generator, quencher or cross-linking catalyst. In some embodiments, the polymer chain 202 is a homopolymer or copolymer comprising repeat unit (monomer) that include PAG-functionalized monomers 204. When a polymer chain 202 including PAG is in contact with a PAG-free photoresist, PAG-polymer chain 202 can be induced (e.g., through EUV exposure) to locally release an acid to trigger a solubility change in the resist. In some exemplary embodiments, one such PAG incorporated into functionalized monomer 204 is expressed by a structural formula:

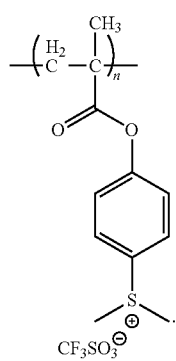

(1)

In some embodiments, one or more functional group within functionalized monomer 204 (1) is selected to generate photo acid locally when PAG containing polymer is selectively grafted. The sulfonium group undergoes decomposition upon exposure to radiation leading to super acid generation (trifluoromethanesulfonic acid) and brings in changes in polarity in the exposed area as compared to unexposed area. Other sulfonium cations can be used in place of (1). Examples of sulfonium include cations where one or both S-Me groups are replaced with S-Ph groups. In addition to the trifluoromethanesulfonate anion in (1), other conjugate bases of acids can be used including nonafluorobutanesulfonate and fluorinated and non-fluorinated sulfonates, tris-trifluoromethylmethanide (($CF_3SO_3)_3C-$), bis-trifluoromethylimide(($CF_3SO_3)_2N-$), phosphonates or carboxylates. A pKA and diffusivity of resulting acid can be tailored to specific application, where pKa is the negative log of the acid dissociation constant or Ka value.

In other embodiments, functionalized surface grafted polymer comprises a PAG expressed by a structural formula:

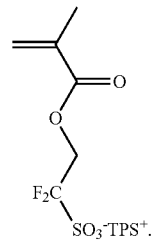

(2)

Shown in (2) is the TPS or triphenylsulfonium cation but a multitude of other radiation-sensitive sulfonium and iodonium cations can be used including those substituted with F and/or I to increase EUV absorbance cross-section. A strong acid can be generated during processing with TPS. The acid may remain attached to the polymer backbone resulting in polarity change of polymer. In addition to fluorinated sulfonate as shown in (2), other anions can be utilized including other sulfonates, phosphonates and carboxylates.

In other embodiments, a functionalized polymer chain includes a base quencher. A quencher is a material that is used to neutralize an acid. In an embodiment, a quencher includes a homopolymer or a copolymer. Examples of quencher material include 2-Vinyl Pyridine, 4-Vinyl Pyridine, 2-(Dimethylamino) ethyl methacrylate, or 2-(Dimethylamino)ethyl acrylate. Further examples include photodecomposable quenchers of similar construction as (2) with sulfonate anion replaced by a basic carboxylate or an anion.

In other embodiments, the functionalized monomer 204 can be used to catalyze crosslinking chemistry upon photo exposure. A cross linking catalyst is a chemical product that forms bonds. In an embodiment, a cross linking catalyst includes a homopolymer or a copolymer.

In other embodiments, a polymer chain includes a plurality of differing side chain polymers. FIG. 2B is a diagram of a surface grafting polymer molecule 200B, including a polymer chain 202, a plurality of surface anchoring groups 203 and a plurality of side polymer chains/functional monomers 204. In the illustrative embodiment, the polymer chain 202 includes at least one surface anchoring group 203 that can terminate on a surface such as on a metal surface 102 (shown in FIG. 1A).

In another embodiment, the polymer chain 202 includes a first polymer chain along a first length $L_1$ and a second polymer chain along a second length $L_2$ as shown in FIG. 2C. The first length $L_1$ may include a plurality of the surface anchoring groups 203 or a plurality of polymer chains/functional monomers 204, or vice versa. In the illustrative embodiment, polymer chain 200C includes a plurality of surface anchoring groups 203 along the first length, $L_1$, and a plurality of polymer chains/functional monomers 204 along the second length, $L_2$. In the illustrative embodiment, at least one of the surface anchoring groups 203 is at a terminus. In an embodiment, the polymer chains/functional monomers 204 can each include a PAG molecule, a PAG monomer or a non-PAG material such as a quencher or a cross linking catalyst.

Figure 3B:
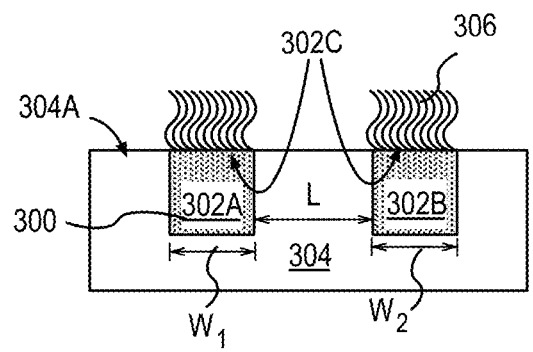
FIG. 3B illustrates the structure of FIG. 3A following the formation of a surface grafted polymer layer selectively grafted on electrode surfaces.
Figure 3C:
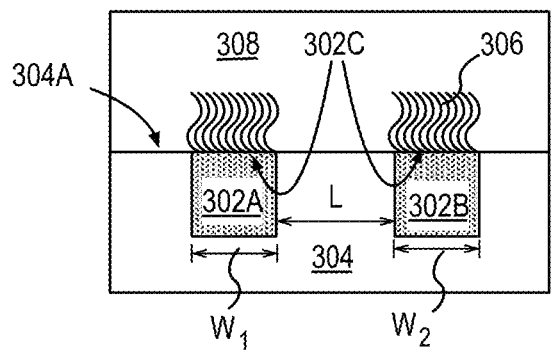
FIG. 3C illustrates the structure of FIG. 3B following the formation of an EUV photoresist on the surface grafted polymer surface grafted polymer layer and on the dielectric.
Figure 3D:
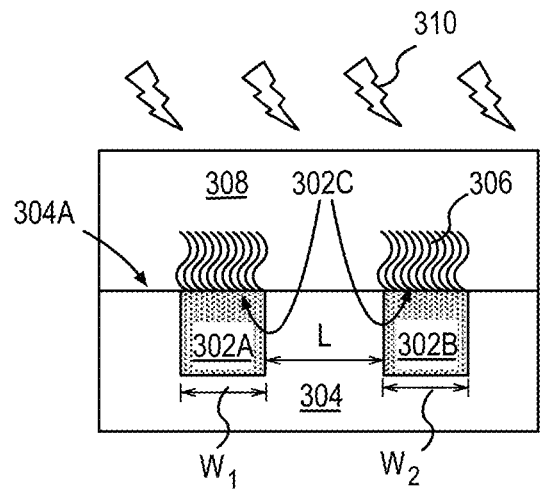
FIG. 3D illustrates the structure of FIG. 3C during a process of flood exposure on the EUV photoresist.
Figure 3E:
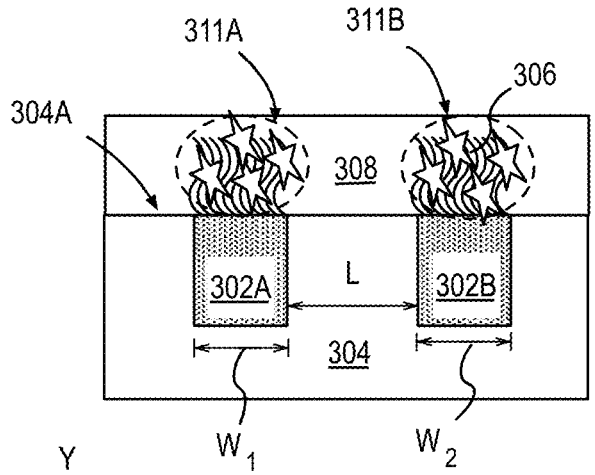
FIG. 3E illustrates the structure of FIG. 3D following the process of flood exposure on the EUV photoresist.
Figure 3F:
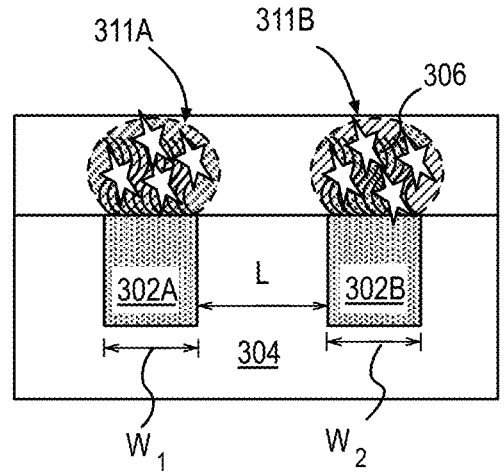
FIG. 3F illustrates the structure of FIG. 3E following the process of post exposure bake of the substrate
Figure 3G:
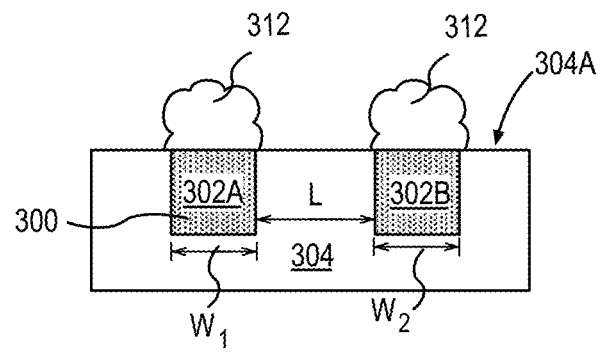
FIG. 3G illustrates the structure of FIG. 3F following the process of developing the EUV photoresist.
Figure 4:
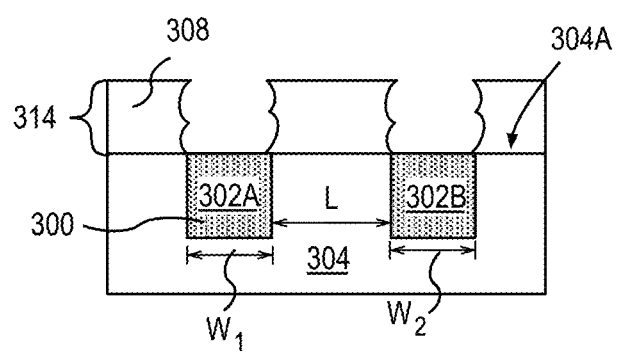
FIG. 4 illustrates the structure of FIG. 3F following the process of developing the EUV photoresist.

An application of the surface grafting polymer layer that is selectively applied to form a pattern is illustrated in FIGS. 3A-4. A photo resist like chemistry can be utilized to amplify pattern replication structure achieved by selective surface grafting of functional polymer.

FIG. 3A is a cross-sectional illustration of heterogenous surface including a material 300 and a material 304. The material 300 may include a metal or a metal alloy and the material 304 may include a dielectric. In the illustrative embodiment, the material 300 is a metal feature 302A. In other embodiments, the material 300 may be shaped into a via electrode. In the illustrative embodiment, the metal feature 302A has a lateral width, $W_1$. In some embodiments $W_1$ is between 5 nm and 100 nm. As shown, the heterogenous surface further includes a metal feature 302B laterally separated from the metal feature 302A by a lateral spacing L. In some embodiments, L is between 5 nm and 100 nm. In an embodiment, $W_1$ and $W_2$ are substantially the same. In other embodiments, $W_1$ and $W_2$ are unequal. Depending on embodiments, $W_1$ and $W_2$ may be greater than or less than L.

Because the pattern replication process utilizes selective surface grafting of functional polymer technique, each of the metal features 302A and 302B may be arbitrarily wide. While two metal features 302B and 302B are shown in FIG. 3A, there may be arbitrary number of metal features 302A or 302B, that are arbitrarily spaced apart. An advantage of the selective surface grafting of functional polymer technique over directed self-assembly process is that the size and spacing of the underlying metal features 302A and 302B do not determine a lateral dimension (along x-axis) of a mask to be formed in downstream processing operation.

FIG. 3B illustrates the structure of FIG. 3A following the formation of a surface grafted polymer layer 306 selectively on surfaces 302C of the material 300. In an embodiment, the surface grafted polymer layer 306 includes a chemical composition described above. In an exemplary embodiment, surface grafted polymer layer 306 includes a PAG containing polymer. The surface grafted polymer layer 306 has a chemical composition that substantially prevents surface grafted polymer layer 306 from forming on a dielectric surface 304A. Thus, surface grafted polymer layer 306 can be formed on an arbitrarily wide metal features 302A and 302B.

FIG. 3C illustrates the structure of FIG. 3B following the formation of an EUV photoresist 308 on the surface grafted polymer layer 306 and on the dielectric 304. In an exemplary embodiment, the EUV photoresist 308 is PAG free. Depending on a desired pattern, the EUV photoresist 308 may have a positive or a negative tone.

In a lithography process, a resist solution may be transferred from the supply bottle, and applied over a workpiece, such as a semiconductor substrate (e.g., wafer). Any application process suitable for applying resist solution may be employed, such as, but not limited to, a spray-coat or a spin-coating process. The solution may be applied to achieve any suitable thickness (e.g., less than 100 nm-1000 nm) over the dielectric 304 and metal features 302A and 302B, and then (pre)baked at a predetermined temperature (e.g., 100-200° C.) to remove at least a portion of the casting agent from the applied layer of resist. During a resist patterning operation, radiation (e.g., within the EUV band) may be emitted, for example with any suitable scanner, onto portions of the resist layer based on a reticle. In a pattern development operation, portions of a resist layer which have been exposed to radiation are removed selectively from portions of the resist layer that are not exposed to radiation.

In some embodiments, a wet develop process is employed to dissolve fragments of the polymer resulting from chain scission process(es), such as any of those described above. The wet developer may be any organic solvent for linear polymer embodiments. For branched polymer embodiments where there is chemical differentiation between the main chain (or core) and branch (arm) chains, the developer may be aqueous (e.g., dilute TMAH).

FIG. 3D illustrates the structure of FIG. 3C during a process of flood exposure 310 on the EUV photoresist 308. While traditional lithography patterning techniques utilize a mask to pattern a layer, the method described in this section highlights the advantage of spatial confinement of PAG component by a selective surface grafting technique. A flood exposure of the PAG free EUV photoresist 308 does not render a same chemical transformation throughout the EUV photoresist 308. The interaction between EUV photons and the surface grafted polymer 306 substantially prevents the entire EUV photoresist 308 from being chemically altered in a same manner. Only portions of the photoresist 308 in the vicinity of the surface grafted polymer 306 are altered. Altered portions of photoresist 308 can be removed during development. Performing a flood exposure and obtaining a patterned photoresist post development is advantageous.

FIG. 3E illustrates the structure of FIG. 3D following the process of flood exposure on the EUV photoresist 308. In an embodiment, flood exposure of EUV photoresist 308 locally releases acid from the surface grafted PAG containing polymer 306. In an embodiment, when the surface grafted polymer layer 306 includes a PAG side chain, acid will be released and confined in the immediate vicinity of the surface grafted polymer layer 306. In an exemplary embodiment, the acid is locally confined to an area inside regions 311A and 311B. The locally confined acid within regions 311A and 311B triggers a solubility change in the PAG free photoresist. The amount of acid released depends on acid-yield with EUV (92 eV) photons, and a span of acid depends on diffusion of the acid within the quencher free EUV photoresist 308.

When an EUV photon is absorbed by the PAG containing surface grafted polymer 306, primary and secondary electrons with energies in the 0-80 eV range are produced. The primary and secondary electrons play an important role in chemical transformations of the PAG containing polymer 306. Specifically, the primary and secondary electrons can induce molecular bond scissions, which releases acid from PAG containing surface grafted polymer and trigger changes in solubility properties of overlaying photoresist 308. Such a change in the overlaying photoresist 308 can subsequently enable a self-pattern formation after a post exposure bake.

FIG. 3F illustrates the structure of FIG. 3E following the process of post exposure bake. The post exposure bake may be performed at a temperature (bake temperature) that may depend on the type of surface grafted polymer material. In some exemplary embodiments, when the surface grafted polymer layer 306 includes a PAG-containing polymer, the bake temperature is between 80 C and 150 C degrees. In some such embodiments, a bake temperature of at least 80 degrees can cause diffusion of acid into the PAG free resist and deprotection of the ester groups in PAG-free resist to carboxylic acids. Post exposure bake may also aid in accelerating the crosslinking process.

FIG. 3G illustrates the structure of FIG. 3F following the process of developing the EUV photoresist 308 with negative tone developer such as an organic solvent. In an embodiment, a portion of the PAG free EUV photoresist 308 that has undergone a change in solubility remains on the dielectric surface 304A after developing. In the illustrative embodiment, the chemically altered PAG free EUV photoresist 308 combines with the material of the surface grafted polymer layer 306 to form a mask 312 substantially over the metal features 302A and 302B. In an embodiment, a small portion of the mask 312 may be formed over material 304.

Once developed, the mask 312 may be employed in any manner known in semiconductor device manufacture, for example, as a mask of an etch process enlisted to remove a thin film material of the workpiece.

FIG. 4 illustrates the structure of FIG. 3F following the process of developing the EUV photoresist with a positive tone developer like TMAH. In an embodiment, a portion of the PAG free EUV photoresist whose solubility is altered is removed post develop to form an inverted mask 314. In some such embodiments, inverted mask 314 exposes the metal features 302A and 302B. In some embodiments the mask 314 may expose surface portions of surface 304A.

The method outlined above in association with FIGS. 3A-4 may be replicated in other surface grafted polymer and resist materials. In another embodiment, a surface grafted polymer containing a quencher material and a quencher free photoresist is utilized to selectively pattern a quencher free photoresist. A quencher free photoresist like chemistry described above can be utilized to amplify pattern replication structure achieved by selective surface grafting.

FIG. 5A illustrates the structure of FIG. 3A following the formation of a surface grafted polymer layer 506 selectively on surfaces 302C of the metal features 302A and 302B. In an embodiment, the surface grafted polymer layer 506 includes a quencher material. In an embodiment, the surface grafted polymer layer 506 has a chemical composition that substantially prevents the surface grafted polymer layer 506 from forming on dielectric surface 304A. Thus, the surface grafted polymer layer 506 can be formed on arbitrarily wide metal features 302A and 302B.

FIG. 5B illustrate the structure of FIG. 5A following the formation of a quencher free EUV photoresist 508 on the surface grafted polymer layer 506 and on the dielectric 304. In an exemplary embodiment, EUV photoresist 508 is a quencher free EUV photoresist 508. Depending on a desired pattern, the quencher free EUV photoresist 508 may have a positive or a negative tone.

FIG. 5C illustrates the structure of FIG. 5B during flood exposure 310 on the quencher free EUV photoresist 508. A flood exposure 310 of the quencher free EUV photoresist 508 does not render a same chemical transformation throughout the quencher free EUV photoresist 508. The interaction between EUV photons and the surface grafted polymer 506 substantially prevents the entire quencher free EUV photoresist 508 from being chemically altered in a same manner.

FIG. 5D illustrates the structure of FIG. 5C following the process of flood exposure of the quencher free EUV photoresist 508. In an embodiment, the process of performing flood exposure 510 on the quencher free EUV photoresist 508 releases acid 509 throughout the resist. In an embodiment, when the surface grafted polymer layer 506 includes a quencher material, the acid 509 will be quenched in the immediate vicinity of the surface grafted quencher containing polymer layer 506. In an exemplary embodiment, the acid 509 is locally confined to an area outside the surface grafted polymer layer 506. The locally confined acid 509 triggers a solubility change in regions of the quencher free EUV photoresist 508 that are away from the surface grafted polymer 506. The amount of acid 509 released depends on acid-yield with EUV (92 eV) photons, and a span of acid 509 depends on diffusion of the acid 509 within the quencher free EUV photoresist 508.

When an EUV photon is absorbed by the surface grafted polymer layer 506, primary and secondary electrons with energies in the 0-80 eV range are produced. The primary and secondary electrons play an important role in chemical transformations of the surface grafted polymer layer 506. Specifically, the primary and secondary electrons can induce molecular bond scissions, which releases acid 509 in a EUV photoresist structure and trigger changes in solubility properties. Such a change in the photoresist 508 can subsequently enable a self-pattern formation after a post exposure bake.

FIG. 5E illustrates the structure of FIG. 5D following the process of post exposure bake and developing the quencher free EUV photoresist 508. In an embodiment, when the quencher free EUV photoresist is a positive tone resist, a portion of the quencher free EUV photoresist that undergoes a change in solubility property remains after developing. In the illustrative embodiment, the chemically altered quencher free EUV photoresist combines with the material of the surface grafted polymer layer 306 to form a mask 512 substantially over the metal features 302A and 302B. In an embodiment, a small portion of the mask 512 may be formed over the material 304, as shown.

Once developed, the mask 512 may be employed in any manner known in semiconductor device manufacture, for example, as a mask of an etch process enlisted to remove a thin film material of the workpiece.

FIG. 6 illustrates the structure of FIG. 5D following the process of developing the quencher free EUV photoresist 508. In an embodiment, when the quencher free EUV photoresist 508 is a negative tone resist, a portion of the quencher free EUV photoresist 508 whose solubility is altered is removed post develop. An inverted mask 514 is formed that exposes the first material 300. In some embodiments the mask 514 may expose portions of surface 304A.

The method outlined above in association with FIGS. 3A-4, and FIGS. 5A-6 may be replicated in other surface grafted polymer and resist systems. Combining PAG containing surface grafted polymer and quencher containing surface grafted polymer may result in better confinement of active species.

FIG. 7A illustrates the structure of FIG. 3A following the formation of a surface grafted polymer layer 306 selectively on surfaces 302C of the material 300. In an embodiment, the surface grafted polymer layer 306 includes a chemical composition described above. In an exemplary embodiment, the surface grafted polymer layer 306 includes a PAG containing polymer. The surface grafted polymer layer 306 has a chemical composition that substantially prevents the surface grafted polymer layer 306 from forming on dielectric surface 304A. Thus, the surface grafted polymer layer 306 can be formed on an arbitrarily wide metal features 302A or 302B.

FIG. 7B illustrates the structure of FIG. 7A following the formation of a surface grafted polymer layer 506 selectively on surfaces 304A of the material 304. In an embodiment, the surface grafted polymer layer 506 includes quencher material. In an embodiment, the quencher containing polymer layer 506 has a chemical composition that substantially prevents the quencher containing polymer layer 506 from being formed on a metal surface 302C. Thus, the quencher containing polymer layer 506 can be formed on an arbitrarily wide dielectric surface 304A. The presence of the quencher containing polymer 506 and the PAG containing polymer layer 306 help confinement of active species during subsequent operations.

FIG. 7C illustrates the structure of FIG. 7B following the formation of an overlay photoresist 308 on the surface grafted polymer layer 306 and on the dielectric 304. In an exemplary embodiment, the EUV photoresist 308 is PAG free. Depending on a desired pattern, the PAG free EUV photoresist 308 may have a positive or a negative tone.

FIG. 7D illustrates the structure of FIG. 7C following the process of flood exposure on the overlay photoresist 308 and following the process of post exposure bake. In an embodiment, the process flood exposure on the overlay photoresist 308 locally releases acid 702 from the surface grafted polymer 306. In an embodiment, when the surface grafted polymer layer 306 includes a PAG side chain, acid 702 that is released is confined in the immediate vicinity of the surface grafted polymer layer 306. The presence of the quencher containing surface grafted polymer layer 506 will help to neutralize the acid that may diffuse into the vicinity of the quencher containing surface grafted polymer layer 506. In an exemplary embodiment, the acid is locally confined to an area inside region 311A and 311B. The locally confined acid 702 triggers a solubility change in the PAG free photoresist. The amount of acid released depends on acid-yield with EUV (92 eV) photons, and a span of acid depends on diffusion of the acid within the PAG free EUV photoresist 308.

When an EUV photon is absorbed by the overlay photoresist 308, primary and secondary electrons with energies in the 0-80 eV range are produced. The primary and secondary electrons play an important role in chemical transformations of the surface grafted polymer layer 306. Specifically, the primary and secondary electrons can induce molecular bond scissions, which releases acid in an overlay photoresist 308 and triggers changes in solubility properties. Such a change in the overlay photoresist 308 can subsequently enable a self-pattern formation after a post exposure bake.

A temperature for post exposure bake may depend on the type of surface grafted polymer material. In an exemplary embodiment, when the surface grafted polymer layer 306 includes a PAG-containing polymer, and the surface grafted polymer 506 includes a quencher material the bake temperature is between 100 degrees C. and 230 degrees C.

FIG. 7E illustrates the structure of FIG. 7D following the process of developing the EUV photoresist. In an embodiment, when the overlay photoresist is a positive tone resist, the surface grafted polymer layer 506 remains on the dielectric surface 304A post developing. In the illustrative embodiment, the chemically altered overlay photoresist 308 combines with the material of the surface grafted polymer layer 306 to form a mask 704 substantially over the metal features 302A and 302B. In an embodiment, a small portion of the mask 704 may be formed over the dielectric 304. However, the portion of the mask 704 formed over the dielectric 304 may be substantially reduced when a quencher material is present on the dielectric surface 304A.

Once developed, the mask 704 may be employed in any manner known in semiconductor device manufacture, for example, as a mask of an etch process enlisted to remove a thin film material.

FIG. 8 illustrates the structure of FIG. 7D following the process of developing EUV photoresist (such as EUV photoresist 308 shown in FIG. 7D). In an embodiment, when the EUV photoresist 308 is a negative tone resist, a portion of the PAG free EUV photoresist 308 whose solubility is altered is removed post develop. An inverted mask 800 is formed that exposes the metal features 302A and 302B. In some embodiments the mask 800 may expose surface portions of surface 304A.

The method outlined above in association with FIGS. 3A-4 may be replicated in other surface grafted polymer and resist systems. In another embodiment, a catalyst containing surface grafted polymer and a cross linkable polymer is utilized to selectively pattern a cross linkable polymer. A photo resist like chemistry can be utilized to amplify pattern replication structure achieved by selective surface grafting polymer.

FIG. 9A illustrates the structure of FIG. 3A following the formation of a catalyst containing surface grafted polymer layer 906 selectively on surfaces 302C of metal features 302A and 302B. In an embodiment, a catalyst containing surface grafted polymer layer 906 includes a material that is the same or substantially the same as the catalyst containing surface grafted polymer described above. In an embodiment, the catalyst containing surface grafted polymer layer 906 has a chemical composition that substantially prevents the catalyst containing surface grafted polymer layer 906 from forming on a dielectric surface 304A. Thus, the catalyst containing surface grafted polymer layer 906 can be formed on an arbitrarily wide metal features 302A and 302B.

FIG. 9B illustrates the structure of FIG. 9A following the formation of a cross linkable polymer 908 on the catalyst containing surface grafted polymer layer 906 and on the dielectric 304. In an exemplary embodiment, cross linkable polymer 908 includes an organosilane oligomeric or polymeric organosilane sensitive to the catalyst of the surface grafted polymer layer.

FIG. 9C illustrates the structure of FIG. 9B during a process of flood exposure 310 of the cross linkable polymer 908. While traditional lithography patterning technique utilizes a mask to pattern a layer, the method outlined herein provides an advantage of a forming a polymer containing mask by a selective surface grafted polymer grafting technique. A flood exposure of the cross linkable polymer 908 does not render a same chemical transformation throughout the cross linkable polymer 908. The interaction between EUV photons and the surface grafted polymer 906 substantially prevents the entire cross linkable polymer 908 from being chemically altered in a uniform manner Specifically, a local area in the vicinity of the surface grafted polymer 906 experiences a solubility change.

FIG. 9D illustrates the structure of FIG. 9C following the process of flood exposure of the cross linkable polymer 908. In an embodiment, the process of performing flood exposure on the cross linkable polymer 908 locally releases acid 909 from the surface grafted polymer 906. In an embodiment, acid will be released and confined in the immediate vicinity of the surface grafted polymer layer 906. In an exemplary embodiment, the acid is locally confined to an area inside regions 911A and 911B. The locally confined acid 909 triggers a solubility change in the cross linkable polymer 908 material. The amount of acid 909 released depends on acid-yield with EUV (92 eV) photons, and a spatial span of acid 909 depends on diffusion of the acid within the cross linkable polymer 908.

When an EUV photon is absorbed by the cross linkable polymer 908, primary and secondary electrons with energies in the 0-80 eV range are produced. The primary and secondary electrons play an important role in chemical transformations of the cross linkable polymer 908. Specifically, the primary and secondary electrons can induce molecular bond scissions, which releases acid in a cross linkable polymer 908 and trigger changes in solubility properties.

Such a change in the cross linkable polymer 908 can subsequently enable formation of a pattern after a post exposure bake.

FIG. 9E illustrates the structure of FIG. 9D following the process of post exposure bake of the substrate. The bake temperature may depend on the type of surface grafted polymer material. In an exemplary embodiment, the catalyst containing surface grafted polymer layer 906 is baked at a temperature between 100 degrees C. and 230 degrees C.

FIG. 9F illustrates the structure of FIG. 9E following the process of developing the cross linkable polymer 908 illustrated in FIG. 9E. Because the cross linkable polymer is a positive tone resist a portion of the cross linkable polymer having a change in solubility property remains post develop. In the illustrative embodiment, the chemically altered cross linkable polymer combines with the material of the catalyst containing surface grafted polymer layer to form a mask 912 substantially over the first material 300 of the heterogenous surface. In an embodiment, a small portion of the mask 912 may be formed over the dielectric material 304.

Once developed, the mask 912 may be employed in any manner known in semiconductor device manufacture, for example, as a mask of an etch process enlisted to remove a thin film material.

The method outlined above in association with FIGS. 3A-4 may be replicated in other surface grafted polymer and resist systems. In another embodiment, a surface grafted polymer containing quencher material and a quencher free photoresist is utilized to selectively pattern a quencher free photoresist. A photoresist like chemistry can be utilized to amplify pattern replication structure achieved by selective surface grafted polymer grafting.

FIG. 10A illustrates the structure of FIG. 3A following the formation of a surface grafted polymer layer 506 selectively on surface 304A of the material 304. In an embodiment, the surface grafted polymer layer 506 includes a quencher material. In an embodiment, the surface grafted polymer layer 506 has a chemical composition that substantially prevents the surface grafted polymer layer 506 from being formed on a metal surface 302C. Thus, the surface grafted polymer layer 506 can be formed on an arbitrarily wide spacing between metal features 302A and 302B.

FIG. 10B illustrates the structure of FIG. 10A following the formation of EUV photoresist 508 on the surface grafted polymer layer 506 and on the metal features 302A and 302B. In an exemplary embodiment, EUV photoresist 508 is a quencher free EUV photoresist 508. Depending on a desired pattern, the quencher free EUV photoresist 508 may have a positive or a negative tone.

FIG. 10C illustrates the structure of FIG. 10B during a process of EUV exposure 310 of the quencher free EUV photoresist 508. By using a traditional lithography patterning technique, a mask 1000 is used to block EUV from reaching a portion of quencher free EUV photoresist 508. However, the mask 1000 exposes a portion of both materials 300 and 304 of the heterogenous surface. A masked exposure of the quencher free EUV photoresist 508 does not render a same chemical transformation throughout the quencher free EUV photoresist 508. The interaction between EUV photons and the surface grafted polymer 506 substantially prevents the entire quencher free EUV photoresist 508 from being chemically altered in a same manner.

FIG. 10D illustrates the structure of FIG. 10C following the process of masked EUV exposure of the quencher free EUV photoresist 508. In an embodiment, the process of performing masked EUV exposure on the quencher free EUV photoresist 508 locally releases acid 1001 from the surface grafted polymer 506. In an embodiment, when the surface grafted polymer layer 506 includes a quencher material, acid 1001 will be released and confined in the immediate vicinity of the surface grafted polymer layer 506. The locally confined acid triggers a solubility change in the surface grafted polymer layer 506. The amount of acid 1001 released depends on acid-yield with EUV (92 eV) photons, and a spatial span of acid 1001 depends on diffusion of the acid within the quencher free EUV photoresist 508. In the illustrative embodiment, some of the acid 1001 extends over the metal surface 300A.

When an EUV photon is absorbed by the resist, primary and secondary electrons with energies in the 0-80 eV range are produced. The primary and secondary electrons play an important role in chemical transformations of the quencher free EUV photoresist 508. Specifically, the primary and secondary electrons can induce molecular bond scissions, which releases acid 1001 in a EUV photoresist 508 and trigger changes in solubility properties.

FIG. 10E illustrates the structure of FIG. 10D following the process of post exposure bake of the EUV photoresist 508. The bake temperature may depend on the type of surface grafted polymer material. In an exemplary embodiment, when the surface grafted polymer layer 506 includes a quencher—containing polymer, the bake temperature is between 80 C-150 C degrees.

FIG. 10F illustrates the structure of FIG. 10E following the process of developing the baked quencher free EUV photoresist 508.

In the approaches described above, the process of releasing acid from the photo resist and localizing an area over which the acid can diffuse can become challenging. Acid can diffuse laterally over short distances from above one type of material in a heterogeneous surface to above another material in the heterogeneous surface. For example, in FIG. 3E the regions 311A and 311B can extend laterally if there is lateral diffusion (along X-axis). Lateral diffusion can create larger feature sizes and potentially increase line edge roughness. In an embodiment, lateral diffusion can be controlled by subjecting the resist to an external electric field post flood exposure.

Figure 11:
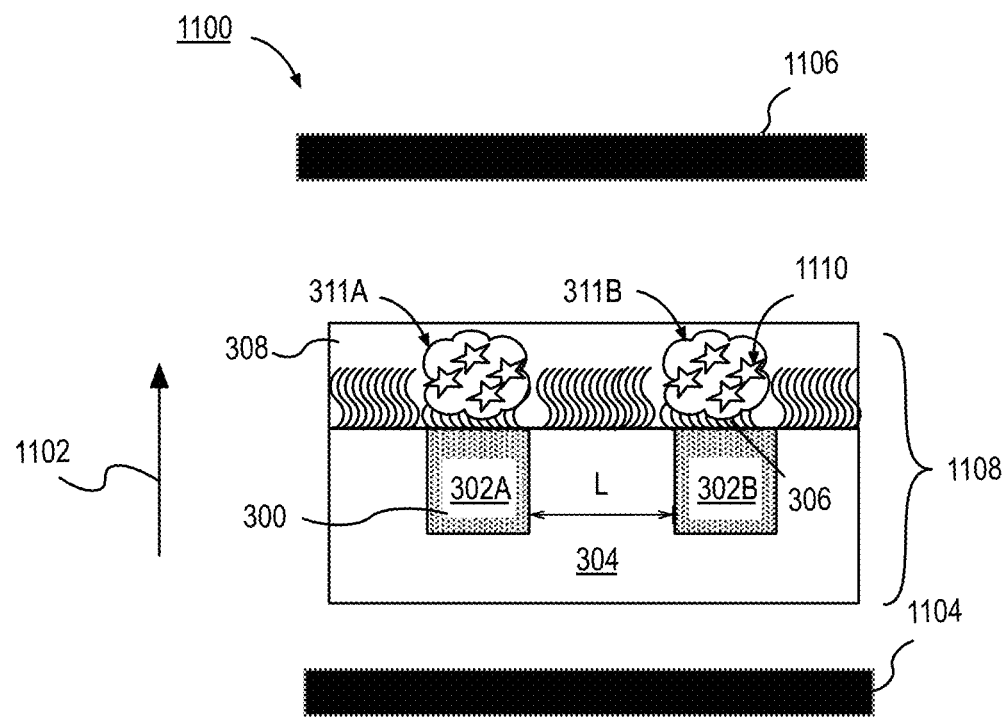
FIG. 11 is a cross-sectional illustration of an apparatus that generates a transverse electric field.

FIG. 11 is a cross-sectional illustration of an apparatus 1100 that generates a transverse electric field 1102. The apparatus 1100 that is utilized to generate the electric field 1102. As shown apparatus 1100 includes an electrode 1104 and an electrode 1106, above electrode 1104. In an embodiment, a substrate 1108 including a post flood exposed photoresist 308 is placed between the electrodes 1104 and 1106. Upon application of an electric field 1102, the polar molecules in the acid 1110, in a region within and above the PAG surface grafted polymer 306, will be directed along the Y-direction as shown in the Figure. The acid 1110 may preferentially diffuse in a vertical over a lateral direction due to the transverse electric field 1102 resulting in feature sizes that match lateral dimensions of the surface grafted polymer material. The apparatus 1100 and a generated electric field 1102 can, thus, be utilized to enable enhanced confinement of acid 1110 within a localized region of a substrate 1108.

FIG. 12 is a cross sectional illustration of a surface grafted polymer material 1200 formed above a substrate 1202. In an embodiment, the surface grafted polymer material has a chemical composition as described above in association with FIG. 2A, and as shown in the enhanced cross-sectional illustration in FIG. 13.

In an embodiment, an EUV lithography compatible photoresist 1204 is formed on the surface grafted polymer as illustrated in FIG. 14A. As illustrated in FIG. 14B, a mask 1206 is used to preferentially cover a portion of the EUV compatible photoresist 1204. Portion of the photoresist 1204 exposed by the mask 1206 is subject to EUV lithography exposure 1203. The exposed photoresist 1204 is baked and developed in a subsequent operation. Depending on whether the photoresist 1204 includes a positive or a negative tone resist, exposed or covered portions of the photoresist 1204 will remain above the substrate 1202 after developing the resist. FIG. 14C is a cross-sectional illustration of a EUV compatible photoresist 1204 having a positive tone that has been exposed as illustrated in FIG. 14B and then developed. FIG. 14D is a cross-sectional illustration of a EUV compatible photoresist 1204 having a negative tone that has been exposed (as illustrated in FIG. 14B) and developed.

In the above discussions, surface grafted polymer comprising various PAG and non-PAG materials such as those described in association with FIGS. 3A-10F (or underlayer) were applied to EUV compatible resist and lithographic exposures. Whereas the various surface grafted polymers described in association with FIGS. 3A-10F were coated by EUV wavelength compatible photoresists, and subsequently flood exposed, in other embodiments the surface grafted polymers themselves can be patterned by EUV wavelength light exposure without utilizing a patterned photo resist and combined with techniques developed for directed self-assembly utilizing block copolymer to render nanometer size feature sizes. Chemical patterning of surface grafted polymer layer for DSA applications requires pattern transfer of photoresist material to an underlying surface grafted polymer layer. As target line and pitch dimensions for various features in integrated circuit applications approach single digit nanometer scale, preserving integrity of patterned photoresist lines becomes challenging. Issues such as pattern collapse and lack of adequate etch selectivity between photoresist and underlying material can be barriers for device fabrication. Direct patterning of surface grafted polymer layer (without photoresist) and combining directed self-assembly with patterned surface grafted polymer layer can help to solve some of the challenges described above.

In accordance with embodiments of the present disclosure, various direct patternable surface grafted polymer layers are described. In an embodiment, a surface grafted polymer layer includes a block copolymer having a block that can undergo chain scission reaction upon photon (or electron) exposure. In another embodiment, a surface grafted polymer has a surface anchoring group which can be cleaved by photon (or electron) exposure or reaction with subsequent photo acid/base material. In another embodiment, a surface grafted polymer includes a material that can undergo polarity switching upon photon (or electron) exposure.

Figure 15A:
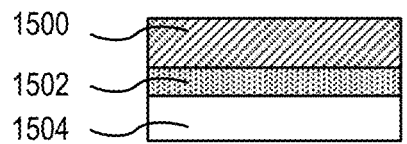
FIG. 15A is a cross-sectional illustration of a surface grafted polymer underlayer formed on a homogenous material above a substrate.

FIG. 15A is a cross sectional view of a surface grafted polymer underlayer 1500 formed on a homogenous material 1502 above a substrate 1504. Various compositions of surface grafted polymer underlayer 1500 are described further below.

Figure 15B:
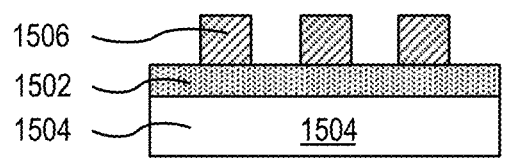
FIG. 15B illustrates the structure of FIG. 15A following the patterning of the surface grafted polymer layer to formed patterned surface grafted polymer layer.

FIG. 15B illustrates the structure of FIG. 15A following the patterning of the surface grafted polymer layer 1500 selectively to the homogenous material 1502 to form patterned surface grafted polymer layer 1506. Methods to pattern the surface grafted polymer layer 1500 will be described further below.

Figure 15C:
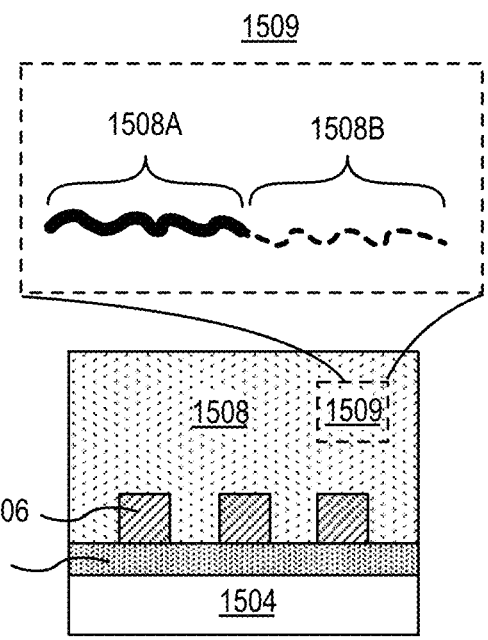
FIG. 15C illustrates the structure of FIG. 15B following the formation of a block copolymer on the patterned surface grafted polymer layer and following the process to bake the block copolymer.

FIG. 15C illustrates the structure of FIG. 15B following a process to spin coat a block copolymer 1508 on the patterned surface grafted polymer layer 1506 and following the process to bake the block copolymer 1508 for self-assembly. The block copolymer 1508 may include a polymer 1508A and an attached polymer 1508B as shown in the enhanced cross-sectional illustration of the region 1509.

Figure 15D:
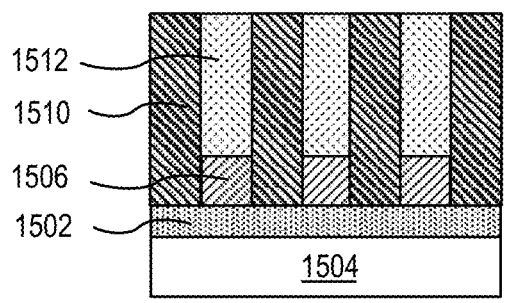
FIG. 15D illustrates the structure of FIG. 15C following the process of self-assembly of the block copolymer into repeated patterns of a first polymer line structure and a second polymer line structure directly adjacent to the first polymer line structure and on the homogenous material.

FIG. 15D illustrates the structure of FIG. 15C following the process of self-assembly of the block copolymer into repeated patterns of a polymer line structure 1510 and a polymer line structure 1512 directly adjacent to the polymer line structure 1510. In the illustrative embodiment, the polymer line structure 1510 is formed on the homogenous material 1502. In the illustrative embodiment, the polymer line structure 1512 is formed on the surface grafted polymer layer 1506.

Figure 15E:
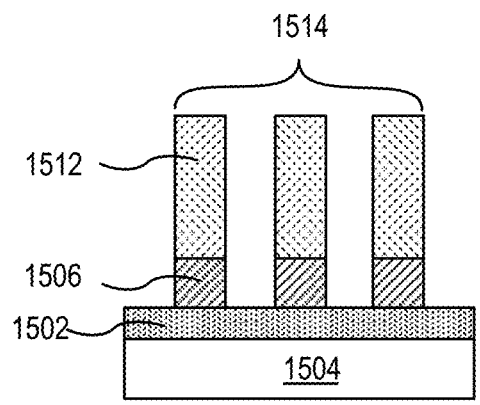
FIG. 15E illustrates the structure of FIG. 15D following the patterning or removal of the second polymer line structure selectively to the first polymer line structure.

FIG. 15E illustrates the structure of FIG. 15D following the patterning or removal of the polymer line structure 1510 selectively to the polymer line structure 1512. In an embodiment, the polymer line structure 1512 is a polystyrene material and the polymer line structure 1510 is a poly methyl methacrylate material. The structure 1514 including the polymer line structure 1512 and the underlying patterned surface grafted polymer layer 1506 may be utilized to pattern the homogenous material 1502 in a subsequent operation. The line integrity of the structure 1514 is substantially enhanced when patterned over a pre-patterned surface grafted polymer layer 1506.

As illustrated in FIG. 16A, in an embodiment, a direct patternable surface grafted polymer 1600 includes an EUV scissionable polymer chain 1602 and a surface anchoring group 1604 attached to a terminus of the polymer chain 1602, above a substrate 1606. EUV lithography applications include monomer functional groups that improve the kinetics and/or thermodynamics of the scission mechanism. In accordance with further embodiments, chain scission resists suitable for EUV lithography applications include monomer functional groups that reduce the risk that leaving groups generated through the scission mechanism may chemically corrode equipment processing a high volume of workpieces (e.g., semiconductor wafers) that have been coated with the chain scission resist.

Embodiments of positive tone chain scission resist compositions described herein may be employed in any (nano) lithography application but may be particularly advantageous for direct EUV print applications, which may be enlisted in high volume microelectronics fabrication, for example at the sub-7 nm complementary metal-oxide-semiconductor (CMOS) technology node. In contrast to multi-patterning, direct printing is a single patterning using a single reticle mask, rather than two or even three masks typical of multipatterning. Improved kinetics displayed by the resist compositions described further below may enable sufficiently small, printed feature pitches to avoid the use of complex Edge Placement Error (EPE) mitigation schemes. Improved kinetics displayed by the exemplary resist compositions described further below may also have higher efficiency (sensitivity), allowing for lower doses and higher scanner throughput. Although these advantages are particularly important in the context of direct EUV print applications, various embodiments of chain scission resist compositions described herein may also be applicable to e-beam lithography applications.

In accordance with embodiments herein, a EUV scissionable polymer chain 1602 includes a polymer that will undergo one or more chain scission mechanisms upon exposure to EUV radiation. In some embodiments, the polymer is a homopolymer including primarily a single monomer. In other embodiments, the polymer is a copolymer including primarily two or more monomers of distinct chemical composition. In some exemplary embodiments, the UV scissionable polymer chain 1602 includes a plurality of acrylate-based monomers, and has the structural formula:

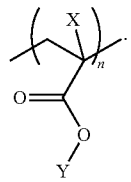
(3)

In accordance with some embodiments, one or more functional group within monomer structure (3) is selected to improve the polymer's EUV sensitivity and/or reduce the chemical corrosivity of chain scission reaction products. The functional group represented in the above structure by 'X' is a suitable "leaving group," as further described below. In further embodiments, the X functional groups denoted in structures (3) may also be EUV absorbing groups that improve sensitivity of the scission resist and lead to a different chain scission mechanism where X is not a leaving group. The EUV absorbing group may be an alkyl halide, with some exemplary EUV absorbing groups being fluoroalkyl substituents (e.g., —$CF_3$, —$CF_2CF_3$, —$CF_2CF_2CF_2CF_3$), which can have significant EUV absorbance.

As noted above, either of polymer structures (3) may include a variety of substituent groups represented by X. In some embodiments, the substituent is a leaving group such as a halide (e.g., X being any of Cl, F, Br, or I bonded to the backbone carbon). In some advantageous embodiments X includes a halide other than chlorine, or other good anionic leaving groups such as a tosylate (toluenesulfonate) group, a triflate (trifluoromethanesulfonate) group, or a triflimide (bissulfonimide) group, or a trifluoroacetate group.

The functional group represented in the above structure by 'Y' may advantageously stabilize cationic or radical intermediates of one or more scission reaction pathways, as further described below. In addition to, or in the alternative, the functional group represented by Y may also be an EUV absorbing group, as further described below. In contrast to e-beam applications, in EUV applications some photon energy may coincide with material absorption bands so that sensitivity may be improved through photochemical effects as well as the radiation chemical effects associated with energies exceeding C—C bond energy where electron-solid interactions become important.

The monomer structure (3) may be employed in homopolymer scission resist embodiments where X and Y do not vary. The monomer structure (3) may also be employed in copolymer scission resist embodiments where at least one of X and Y in a first monomer of the copolymer differs from X and Y in a second monomer of the copolymer. The monomer structure (3) may also be employed in copolymer scission resist embodiments further including a monomer having a styrene-based structure. In some exemplary embodiments, such a copolymer has the structural formula:

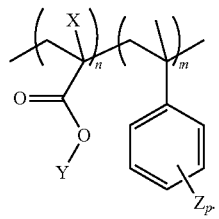
(4)

For the copolymer structure (4), X may again be a leaving group, and/or may be an EUV absorbing group, as further described below. Similarly, Y may again stabilize cationic or radical intermediates, and/or may be an EUV absorbing group. In structure (4), the functional group represented 'Z' is advantageously an "electron donating group." As described further below, functional group Z may help the aromatic group to stabilize a radical intermediate of the chain scission mechanism, improving the chain-scission efficiency relative to a baseline α-methylstyrene structure. In addition, or in the alternative, the functional group represented by Z may be an EUV absorbing group. As denoted by the subscript, p, there may be 1 to 5 of the Z functional groups with hydrogens of the aromatic group being fully substituted when p=5. For some exemplary embodiments, a resist having copolymer structure (4), the n:m ratio is 1:1, but the ratio may vary, for example from about 10:1 to 1:10. Number average molecular weights of both homopolymer and copolymer embodiments may vary widely, for example from (Mn) of 2,000 to 500,000.

As noted above, in some embodiments the functional group Y may advantageously stabilize the development of positive charge and/or radical character during the chain cleavage reaction. A variety of aliphatic or aromatic groups may offer greater stability than the baseline. Some specific aliphatic examples are a methyl group, or an ethyl group, or a propyl group, or an isopropyl group, or a tert-butyl group. Aryl group embodiments, for which an R group is between the O and the aryl constituent, may offer more stability than do aliphatic groups. In one example, the functional group Y is a benzyl group (—$CH_2Ph$) with $CH_2$ between O and the phenyl group. In some alternative embodiments, the functional group Y is a trialkylsilylethyl ($R_3SiCH_2CH_2$— where R is an alkyl substituent), which may similarly act to stabilize the development of positive charge and/or radical character within the chain scission pathway. Exemplary trialkylsilyl groups include a trimethylsilyl ($SiMe_3$) group, a triethylsilyl ($SiEt_3$) group, or a triphenylsilyl ($SiPh_3$) group. Any of these trialkylsilyl groups may be at the terminus of an ester carbon chain that includes 1-10 carbon atoms. For stabilizing positive charge development, having two carbons between Si and O will best allow hyperconjugation to stabilize charge. Hence, in some advantageous trialkysilyl embodiments, there are two —$CH_2$ groups between the O and the Si atom (e.g., a trimethylsilylethyl-substituent).

In some other embodiments, Y is an EUV absorbing substituent functional group. Exemplary EUV absorbing groups include alkyl halides and aryl halides. For such embodiments, the halide is advantageously a fluoride or iodide, for example to avoid potentially corrosive chain scission byproducts. In some examples, the Y group is a fluoroalkyl, fluoroarene, iodoalkyl or iodoarene. Fluoroalkyl embodiments may comprise an ester carbon chain having 1-10 carbon atoms off the O atom in structure (3) or (4). In some exemplary fluoroalkyl embodiments, the fluoroalkyl is completely saturated with fluorine (i.e., a perfluoroalkyl). For example, the Y group may be a trifluoromethyl (—CF$_3$) group, or a pentafluoroethyl group (—CF$_2$CF$_3$). In aryl halide embodiments, an R group comprising one or two carbon atoms is advantageously between the O atom and the aryl halide (e.g., fluoroarene) substituent. For example, the fluoroarene may be a pentafluorophenyl (C$_6$F$_5$—) or 3,5-bis-trifluoromethylphenyl (3,5-(CF$_3$)$_2$—C$_6$H$_3$—) group.

Other examples of scissionable polymer materials that can be attached to surface include polyphthalaldehydes which are known to depolymerize upon exposure to photogenerated acid or high energy radiation or electrons. An example is shown here:

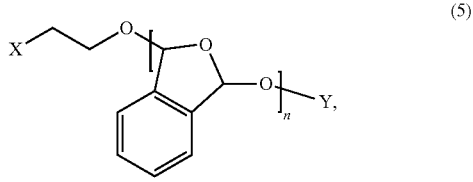

(5)

where X is a surface anchor group and Y is a photo- or acid-activated trigger.

Other scissionable polymers include those with sulfate, sulfonate, phosphonate, phosphate, ester, anhydride, urea, carbamate and other related EUV-sensitive functionality in main chain of polymer with surface attachment group on one or both ends. These polymers can be scissioned through direct reaction with EUV photons or electrons.

In accordance with embodiments, the surface anchoring group 1604 includes a hydroxyl (—OH), carboxy (—COOH) chain or a reactive Si—X group such as aminosilane, chlorosilane or alkoxysilane.

In an embodiment, the direct patternable surface grafted polymer 1600 above substrate 1606 is subjected to EUV lithography exposure 1610 through a mask 1608 as illustrated in FIG. 16A. The scissionable polymer chain 1602 exposed by the mask undergoes a chain scission reaction upon photo or (electron) exposure 1610.

FIG. 16B illustrates the structure of FIG. 16A following the removal of portions of scissioned polymer chain 1602. In an embodiment, portions of scissioned polymer chain 1602 are removed by a reaction with a photo acid or base. In some such embodiments, portions of surface anchoring group 1604 remain on the substrate 1606.

In other embodiments, a polymer chain is a block copolymer chain, where one block is chain scissionable upon photon or electron exposure. In an embodiment, a direct patternable surface grafted polymer 1700 includes an EUV scissionable polymer chain 1702 having a first and a second terminus, a surface anchoring group 1704 attached to first terminus of the polymer chain 1702, and a polymer 1706 attached to a second terminus as illustrated in FIG. 17A. The EUV scissionable polymer chain 1702 is the same or substantially the same as EUV scissionable polymer chain 1602 and the surface anchoring group 1704 is the same or substantially the same as surface anchoring group 1604 described above.

The polymer 1706 may include a hydrophobic or a hydrophilic polymer. Examples of hydrophobic polymer include materials such as polyethylene, polystyrene, polyvinylchloride, polytetrafluorethylene, polydimethylsiloxane, some polyesters, some polyurethanes, acrylics, and epoxies. A hydrophobic polymer may be advantageous because of its ability to resolve a half pitch of less than 20 nm and ability to withstand pattern collapse due to capillary forces. In one embodiment the hydrophobic polymer is Polystyrene, and its copolymers are highly transparent to visible radiation and have a high refractive index. Other examples of hydrophobic polymers include P(t-Buytl Acrylate). tert-Butyl Acrylate is a monofunctional monomer that has advantageous properties such as high reactivity, heat resistance, adhesion and chemical resistance.

Examples of hydrophilic polymer include materials such as acrylic acid, acrylamide, and maleic anhydride polymers. Hydrophilic polymers are advantageous for their cross linkable and self-assembly properties. Other examples include a functional group—Amine-functional polymer that includes allylamine, ethyleneimine, oxazoline, and other polymers containing amine groups in their main- or sidechains.

In an embodiment, the direct patternable surface grafted polymer 1700 is subjected to EUV lithography exposure 1710 through a mask 1708 as illustrated in FIG. 17A. The scissionable polymer chain 1702 exposed by the mask 1708 undergoes a chain scission reaction upon photo or (electron) exposure.

FIG. 17B illustrates the structure of FIG. 17A following the removal of portions of scissioned polymer chain 1702 and the attached hydrophobic or a hydrophilic polymer 1706. In an embodiment, the scissioned polymer chain 1702 is removed by a reaction with a photo acid or base.

In a third embodiment, a direct patternable surface grafted polymer 1800 includes a material that can undergo a polarity transformation upon photon (or electron) exposure 1810 through a mask 1808 as illustrated in FIG. 18A. In an embodiment, the direct patternable surface grafted polymer 1800 includes a polarity switchable polymer chain 1802 and a surface anchoring group 1804 attached to the polarity switchable polymer chain 1802, as illustrated in FIG. 18A. Examples of polarity switchable chain 1802 include materials such as ionic chains or nonpolar organics converting to polar organics.

In an exemplary embodiment, polarity switchable polymer chain 1802 includes polyMAPDST given by the structure in (1) above.

Other polarity-switching groups 1802 on side chain of polymer surface grafted polymer include esters, anhydrides, carbonates, carbamates, ureas, sulfonates, phosphonates and related functionality where direct EUV or electron activation may convert side chain from e.g., non-polar ester (6), to polar carboxylic acid (7) as shown below. Cleavable side chain group may either be part of all monomers (homopolymer) or only fraction of monomer units (copolymer).

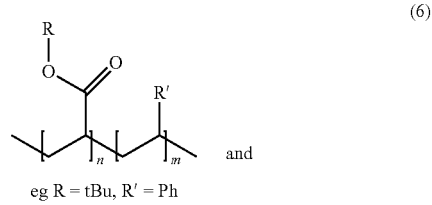

(6)

eg R = tBu, R' = Ph

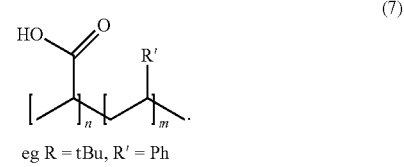

(7)

eg R = tBu, R' = Ph

In an embodiment, the direct patternable surface grafted polymer 1800 is subjected to EUV lithography exposure 1810 through a mask 1808 as illustrated in FIG. 18A. The polarity switchable polymer chain 1802 exposed by the mask undergoes a chain scission reaction upon photon or (electron) exposure.

FIG. 18B illustrates the structure of FIG. 18A following the conversion of portions of polarity switchable polymer chain 1802 post EUVL to form polymer chain 1806.

In other embodiments, a new block copolymer (BCP) design is described. Block copolymers (BCPs) used in DSA patterning have some limitations in that they may generate fixed feature sizes and a fixed pitch between any two features. Fixed feature sizes and a fixed pitch is a result of phase separation of di-block copolymer which have a homopolymer blend. The BCP design, described below, overcomes this limitation by generating patterns that are not limited to fixed pitch or feature sizes.

DSA patterning technique utilize phase separation of BCP to generate dense line patterns. Phase separation of two different polymers in the BCP induces nanoscopic pattern due to the chemical linkage between two polymers. Nanoscale phase separation generates pattern, and its dimension is mainly governed by molecular weight (size) of polymer chain.

In a new BCP design or pseudo-BCP, as referred to herein, phase separation can occur when two polymers are simply mixed (herein, a polymer blend) but not chemically linked to each other. However, phase separation of polymer blend induces macroscopic domains since there is no chemical linkage (i.e., a covalent bond) between mixed two polymers. In some embodiments, the phase separation is uncontrolled yielding random domain sizes and spacing between domains.

Pseudo-BCP also overcomes less desirable features of DSA patterning through use of traditional BCP materials, such as slow reaction kinetics and degradation of polymer quality. Unlike a homopolymer blend which undergoes macro phase separation, pseudo-BCP behaves like regular BCPs during self-assembly. Furthermore, linkage between the two polymers in a pseudo-BCP can be broken chemically, optically or thermally. The pseudo BCP design may be advantageous during patterning of layers that require formation of various feature sizes at varying pitches.

Figure 19A:
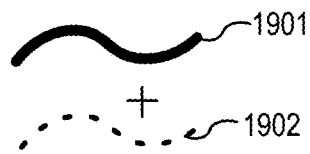
FIG. 19A illustrates a diagram of a two-polymer blend including a first polymer 1901 and a second polymer 1902.
Figure 19B:
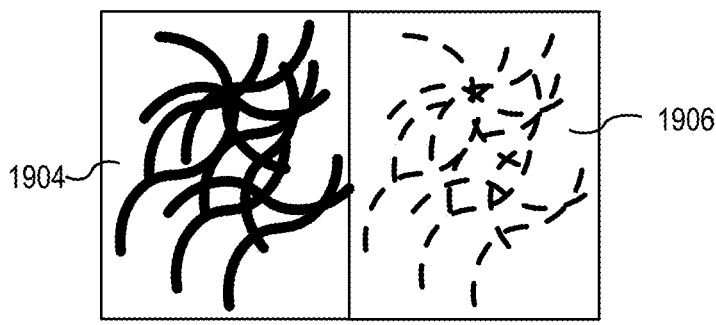
FIG. 19B illustrates phase separation of two polymers.

FIG. 19A illustrates a diagram of a two-polymer blend including a first polymer 1901 and a second polymer 1902. Phase separation can occur when two polymers are simply mixed and not chemically linked to each other as illustrated in FIG. 19B. The phase separation of polymer blend including polymer 1901 and polymer 1902 can induce macroscopic domains since there is no chemical linkage between the two polymers 1901 and 1902 when they are mixed. As shown, a domain 1904 containing a collection of polymers 1901 is adjacent to a domain 1906 containing a collection of polymers 1902. In an embodiment, the phase separation that leads to the formation of the domains 1904 and 1906 is uncontrolled.

In an embodiment, polymer 1901 includes PS and polymer 1902 includes PMMA.

Figure 19C:
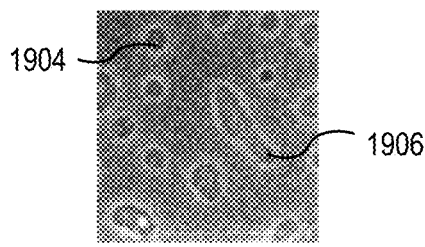
FIG. 19C is a scanning tunneling microscope image of a plan view of substrate that shows the presence of multiple microscopic domains.

FIG. 19C is a scanning tunneling microscope image of a plan view of substrate that shows the presence of multiple microscopic domains 1904 and 1906. The domains 1904 and 1906 do not have a periodic spacing between them or a defined shape or size. As seen, the domains 1904 and 1906 are not directly adjacent to each other.

Figure 20A:
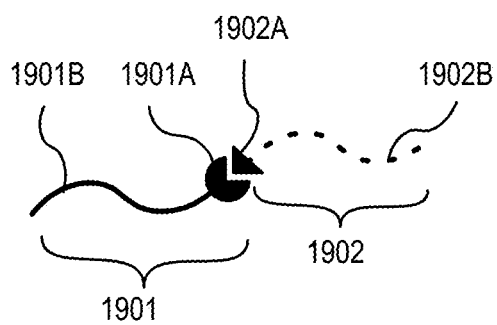
FIG. 20A is an illustration of a first polymer and a second polymer held together by a chemical interaction.

FIG. 20A is an illustration of a chemical composition that includes a polymer 1901 and a polymer 1902 held together by a chemical interaction. The chemical interaction may include a non-covalent bond or a cleavable bond.

Figure 20C:
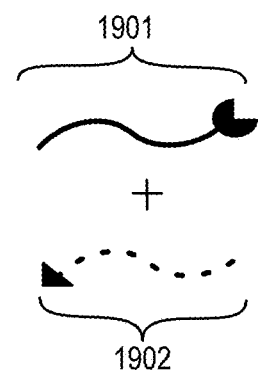
FIG. 20C is an illustration of a phase separation between the first polymer and the second polymer depicted in FIG. 20A.
Figure 20B:
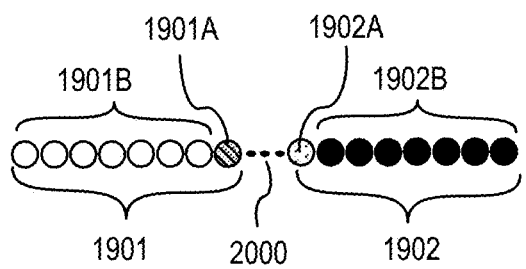
FIG. 20B is an illustration of a first polymer chain including a minor component attached to a major component, where the first polymer chain is bonded to a second polymer chain including a minor component attached to a major component.

As shown in FIG. 20B, the polymer chain 1901 includes a minor component 1901A attached to a major component 1901B. Also as shown, polymer chain 1902 includes a minor component 1902A attached to a major component 1902B. In an embodiment, the minor component 1901A is chemically bonded (indicated by bond 2000) with the minor component 1902A, where the chemical bond includes a non-covalent bond. In some embodiments, the polymer 1901 and polymer 1902 are held together or connected at a terminus of each of the polymer 1901 and polymer 1902. In the illustrative embodiment, the minor component 1901A is at a terminus of the polymer chain 1901 and the minor component 1902A is at a terminus of polymer chain 1902.

The major component 1901B includes a plurality of monomers and the minor component 1901A includes at least a single monomer. As illustrated minor component 1901A includes a single monomer. In general, the majority component 1901B includes greater number of monomers than minority component 1901A.

The major component 1902B includes a plurality of monomers and the minor component 1902A includes at least a single monomer. As illustrated minor component 1902A includes a single monomer. In general, the majority component 1902B includes a greater number of monomers than the minority component. 1901A.

Examples of minor component 1901A include hydrogen bonding forming monomers such as acrylic acid, methacrylic acid, vinyl phosphonic acid, 2-Hydroxyethyl methacrylate, 2-Hydroxyethyl acrylate, N-Hydroxyethyl acrylamide, 4-Hydroxyphenyl methacrylamide. 2-vinyl-pyridine, 4-vinyl-pyridine, 4-hydroxystyrene, acrylonitrile.

Examples of minor component 1901B include polystyrene, poly(methyl methacrylate), polydimethylsiloxane. poly(ethylene oxide), polylactide, poly-L-lactide, poly(pentamethyldisilylstyrene), polyisoprene, Poly(perfluoroalkyl methacrylate).

Example of minor component 1902A include hydrogen bonding forming monomers such as acrylic acid, methacrylic acid, vinyl phosphonic acid, 2-Hydroxyethyl methacrylate, 2-Hydroxyethyl acrylate, N-Hydroxyethyl acrylamide, 4-Hydroxyphenyl methacrylamide. 2-vinyl-pyridine, 4-vinyl-pyridine, 4-hydroxystyrene, acrylonitrile.

Examples of minor component 1902B include polystyrene, poly(methyl methacrylate), polydimethylsiloxane. poly(ethylene oxide), polylactide, poly-L-lactide, poly(pentamethyldisilylstyrene), polyisoprene, Poly(perfluoroalkyl methacrylate).

In exemplary embodiments, minor components 1901A and 1902A are different from each other. In some embodiments, major components 1901B and 1902B are different from each other, whereas in other embodiments, major components 1901B and 1902B include a same material.

FIG. 20C is an illustration of a phase separation between a polymer 1901 and a polymer 1902 depicted in FIG. 20A. The phase separation may be nanoscopic or macroscopic in nature. In an embodiment, when the phase separation is nanoscopic the pseudo BCP behaves like regular BCP where the resulting feature size and pitch are defined by the molecular weight of the polymer 1901 and 1902. In an embodiment, when the phase separation is macroscopic, pseudo BCP behaves like polymer blend where each of the resulting feature size and pitch are not limited to a single dimension.

Figure 21A:
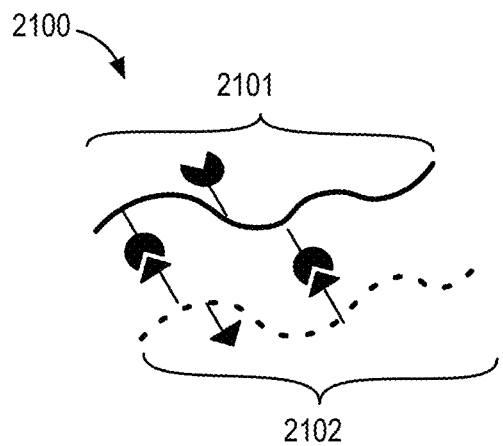
FIG. 21A is an illustration of a first polymer and a second polymer held together by a chemical interaction.

FIG. 21A is an illustration of a chemical composition 2100 that includes a polymer 2101 and a polymer 2102 held together by a chemical interaction. In some embodiments, the polymer 2101 and a polymer 2102 have one or more features of the polymer 1901 and a polymer 1902 (depicted in FIG. 20A or 20B). A single sidechain of polymer 2101 may be held together with a single sidechain of polymer 2102 by a chemical interaction, as shown. The number of side chain interactions may be greater than one. In the illustrative embodiment, two such side chain interactions are depicted. Each side chain interaction may include a non-covalent bond or a cleavable bond.

Figure 21B:
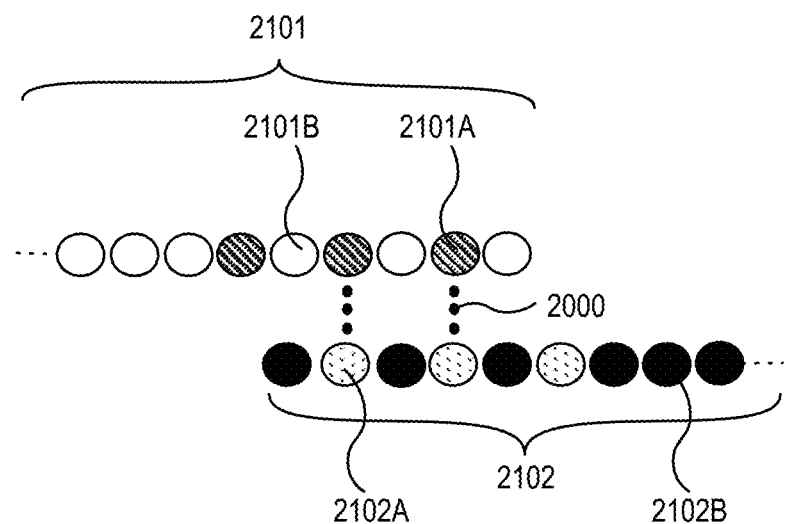
FIG. 21B is an illustration of a first polymer chain including a minor component attached to a major component, where the first polymer chain is bonded by side chains to a second polymer chain including a minor component attached to a major component.

In exemplary embodiments, polymer 2101 includes a major component and a minor component as shown in FIG. 21B. In the illustrative embodiment, major component includes a plurality of monomers 2101B and the minor component includes a plurality of monomers 2101A, where the number of monomers 2101B is greater than the number of monomers 2101A. In general, individual ones of the plurality of monomers 2101A in the minor component do no need to be directly adjacent to each other as shown in the illustration. Individual ones of the plurality of monomers 2101B can be directly adjacent to each other as well as be separated by at least one monomer 2101A, as shown. Furthermore, the monomer.

In exemplary embodiments, polymer 2102 includes a major component and a minor component as shown in FIG. 21B. In the illustrative embodiment, major component includes a plurality of monomers 2102B and the minor component includes a plurality of monomers 2102A, where the number of monomers 2102B is greater than the number of monomers 2102A. In general, individual ones of the plurality of monomers 2102A in the minor component do no need to be directly adjacent to each other as shown in the illustration. Individual ones of the plurality of monomers 2102B in the major component can be directly adjacent to each other as well as be separated by at least one monomer 2102A of the minor component, as shown.

In an embodiment, the chemical composition 2100 including polymer 2101 and polymer 2102 form a block copolymer like structure via supramolecular interaction (H-bonding) of monomers in the minor component of each polymer 2101 and 2102. For example, individual ones of one or more monomers 2101A may be non-covalently bonded (indicated by bond 2000) with individual ones of one or more monomers 2102A. As shown, polymer 2101 and polymer 2102 are held together by a plurality of sidechains, where each sidechain forms a hydrogen bond. While two such sidechains are illustrated, a large number of sidechains is desirable for a stronger H-bond between polymer chain 2101 and 2102. It is to be appreciated that not all monomers 2101A are involved in H-bonding formation with monomers 2102A.

Example of monomer 2101A or 2102A include hydrogen bonding forming monomers such as acrylic acid, methacrylic acid, vinyl phosphonic acid, 2-Hydroxyethyl methacrylate, 2-Hydroxyethyl acrylate, N-Hydroxyethyl acrylamide, 4-Hydroxyphenyl methacrylamide. 2-vinyl-pyridine, 4-vinyl-pyridine, 4-hydroxystyrene, acrylonitrile.

Example of polymer composed by monomer 2101B or 2102B include polystyrene, poly(methyl methacrylate), polydimethylsiloxane. poly(ethylene oxide), polylactide, poly-L-lactide, poly(pentamethyldisilylstyrene), polyisoprene, Poly(perfluoroalkyl methacrylate).

Other examples include substituted styrene monomer (8) and substituted methacrylate (9) each bearing a H-bonding forming pendant group given, respectively by:

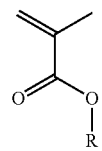

(8)

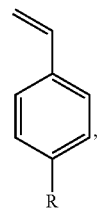

(9)

where, R=nitrile, amine, ester, amide, thiol, alcohol, carboxylic acid, sulfonic acid, adenine, guanine, cytosine, thymine group.

Figure 21C:
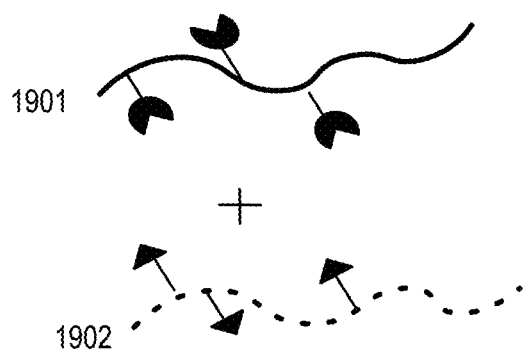
FIG. 21C is an illustration of a phase separation between the first polymer and the second polymer depicted in FIG. 21A.

FIG. 21C is an illustration of a phase separation between a polymer 2101 and a polymer 2102 depicted in FIG. 21A. The phase separation may be nanoscopic or macroscopic in nature.

In other embodiments, a chemical composition includes a polymer chain and a polymer chain where the polymer chain is chemically bonded by a cleaveable bond or a chain scissionable polymer.

Figure 24A:
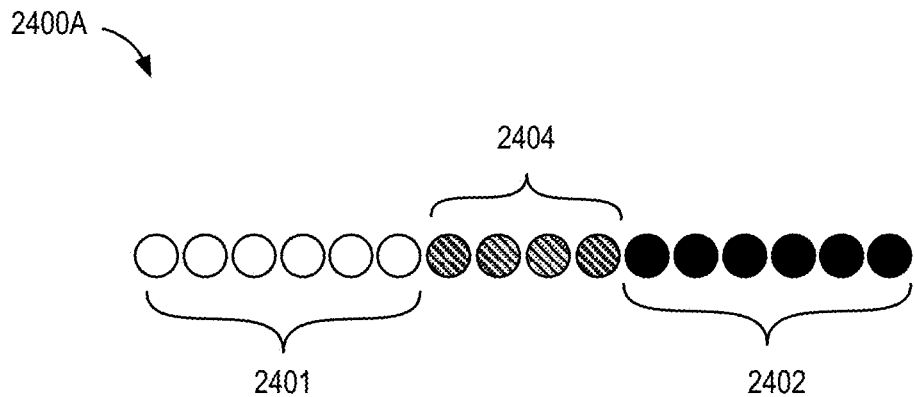
FIG. 24A is an illustration of a cleavable block copolymer where a chain scissionable polymer is between a first polymer and a second polymer.

As illustrated in FIG. 24A a chemical composition 2400A includes a polymer chain 2401 and a polymer chain 2402, where polymer chain 2401 and polymer chain 2402 are chemically bonded by chain scission polymer 2404. In some embodiments, polymer 2401 includes one or more properties of the polymer 1901 or 2101 and chain scission polymer 2404 includes one or more properties of the polymer 1902 and 2102.

Figure 24B:
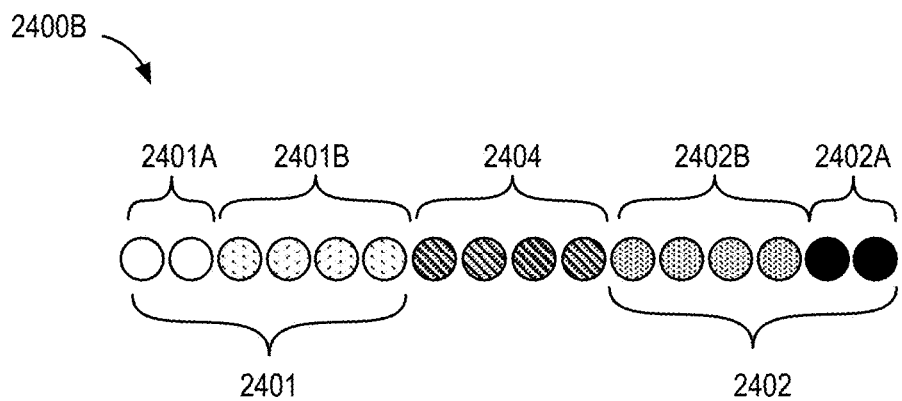
FIG. 24B is an illustration of a cleavable block copolymer where a chain scissionable polymer is between a first polymer and a second polymer, where each of the first and the second polymers have a major and a minor component.

As illustrated in FIG. 24B a chemical composition 2400B includes a polymer chain 2401, a polymer chain 2402 and a chain scission polymer 2404 therebetween, in accordance with an embodiment of the present disclosure. As shown, polymer 2401 includes a major component, where the major component includes a plurality of monomers 2401B and a minor component that includes a plurality of monomers 2401B. In some such embodiments, the polymer 2402 includes a major component, where the major component includes a plurality of monomers 2402B and a minor component that includes a plurality of monomers 2402B. In the illustrative embodiment, monomers 2401B and 2402B are at the terminus of each polymer 2401 or 2402, respectively and a chain scission polymer 2404 is directly bonded between monomers 2401B and 2402B. In other embodiments, monomers 2401A and 2402A are randomly positioned within the polymer chains 2401 and 2402, respectively, but not at the terminus.

In an embodiment, chain scission polymer 2404 includes a material that is the same or substantially the same as 1602. For example, the chain scission polymer 2404 is a plurality of acrylate-based monomers having the structural formula:

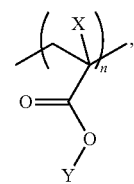

where X is a halide group, a tosylate group, a triflate group, a triflimide group or a $C_XF_Y$ molecule and where Y is a methyl, ethyl, propyl, isopropyl, tert-butyl, cyclohexyl or a silyl group.

Figure 24C:
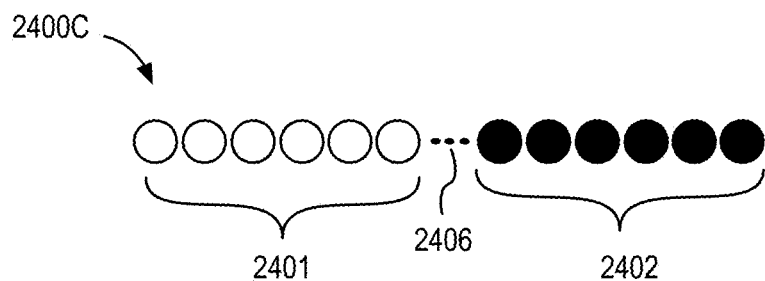
FIG. 24C is an illustration of a cleavable block copolymer where a cleavable linker is between a first polymer and a second polymer.

As illustrated in FIG. 24C a chemical composition 2400C includes a polymer chain 2401 and a polymer chain 2402 and a cleavable linker 2406, therebetween. In some embodiments, polymer 2401 includes one or more properties of the polymer 1901 or 2101 and polymer 2402 includes one or more properties of the polymer 1902 and 2102. In an embodiment, cleavable linker 2406 includes an acetal group, dibenzene phenyl group or a 2-nitrobenzyl group.

FIG. 22A is a cross-sectional illustration of a plurality of domains 1904 and 1906 in a regular BCP patterning scheme. In the illustrative embodiment, the domains 1904 and 1906 are formed over DSA guiding patterns. The domains 1904 is formed above a guiding pattern 2200A and domain 1906 is formed above a guiding pattern 2200B. As shown, domains 1904 and 1906, include polymers 1901 and 1902, respectively.

As shown, the polymers 1901 and 1902 are end to end linked and the resulting feature size and pitch of domains 1904 and 1906 are substantially uniform. Additionally, the feature size and pitch of domains 1904 and 1906 are substantially matched with the feature size and pitch of the guiding pattern 2200A and guiding pattern 2200B, respectively, as shown. As shown the domains 1904 and 1906 are directly adjacent to each other.

FIG. 22B is a scanning tunneling microscope image of a patterned BCP design. In the image, one of the polymers 1901 or 1902 have been selectively removed by a patterning process.

FIG. 23A is a cross-sectional illustration of a plurality of domains 1904 and 1906 in a BCP patterning where the chemical linkage between a first block consisting of polymer 1901 and a second block consisting of polymer 1902, is intentionally broken. In the illustrative embodiment, the BCP has a natural pitch of 50 nm and is formed above a surface grafted polymer pattern having a surface grafted polymer 2300A and a surface grafted polymer 2300B. In the illustrative embodiment, surface grafted polymer 2300A and surface grafted polymer 2300B each have substantially similar lateral widths (along X-direction), and a pitch of 80 nm. As shown, the BCP having a natural pitch of 50 nm cannot be aligned over 80 nm pitch of the surface grafted polymer 2300A and surface grafted polymer 2300B.

In an embodiment, the chemical linkage between a block including polymer 1901 and a block including polymer 1902 is eliminated (by thermal degradation in this case). In some such embodiments, BCP can behave like two polymer blends. Therefore, DSA can be done over p80 nm guiding.

FIG. 23B is a scanning tunneling microscope image of a patterned BCP design. In the image, one of the polymers 1901 or 1902 have been selectively removed by a patterning process.

By combining two different phase separation behaviors described above in association with FIGS. 22A-23B (BCP vs blend) into a new approach, multi-pitch DSA may be enabled. In this new approach, two polymer system can behave like either two chemically linked polymers or like simply blended polymers without chemical linkage between them. To enable this dual property, the pseudo-BCP requires implementation of supramolecular chemistry such as intermolecular forces, electrostatic charge, or hydrogen bonding. Relatively weak and reversible interaction between two polymers, such as polymers 1901 and 1902, can hold two distinct polymers together to prevent macroscopic phase separation.

However, breaking supramolecular interactions by thermal, chemical or optical activation can lead to polymers into two blended polymer which may give rise to macroscopic phase separation.

Covalent chemical bonding that can be cleaved by external activation can also lead BCP like polymers into blended polymer system. By introducing supramolecular interaction chemistry or cleavable covalent bond to BCP can provide improved control of switching between BCP and blend like behavior. The pseudo-BCP design will behave as regular BCP as long as chemical interaction between two polymers, such as polymers 1901 and 1902, is not perturbed. Hence it is expected that there is no macro-phase separation unlike in a simple polymer blend system. Spin coating and thermal baking of polymers 1901 and 1902, under the $T_{pertubation}$ can be applied to pseudo-BCP same as regular BCP. $T_{pertubation}$ is a temperature under which supramolecular interaction is effective.

During a DSA process, however, chemical interaction that holds two polymers can be destroyed (or perturbed) to unlock pitch limitation that stems from chemical linkage between two polymers, such as polymers 1901 and 1902.

Thus, pseudo-BCP may form arbitrary pattern size depending on the dimension of chemical pattern.

In a first example, a chemical composition includes a polymer chain having a surface anchoring group at a terminus of the polymer chain, wherein the surface anchoring group is metal or dielectric selective and wherein the polymer chain further includes at least one of a photo-acid generator, quencher, or a catalyst.

In a second example, for any one of the first example, the polymer chain includes a plurality of photo-acid generators, a plurality of quenchers, or a plurality of catalysts.

In third example, for any one of the first through second examples, the surface anchoring group is metal selective and includes hydroxyl, amines, phosphines, thiol, thiolate, thioacetate, disulfide, alkyl azide, aryl azide, nitrile, phosphate, silyl and alkyl or phosphonate ester, phosphonamide, sulfonamides, sulfenate, sulfinate, sulfonate, boronic acid, phosphonic acids, carboxylic acids, phosphorous dichloride, alkenes or alkyne.

In fourth example, for any one of the first through third examples, the surface anchoring group is dielectric selective and includes alkoxysilanes, aminosilanes, or chlorosilanes, or mono-, di- and tri-substituted groups of alkoxysilanes, aminosilanes, or chlorosilanes.

In fifth example, for any one of the first through fourth examples, the polymer chain includes side polymer chains, and the side polymer chains include polymers of photo-acid generators, quencher, or catalyst.

In sixth example, for any one of the first through fifth examples, wherein the main chain includes one surface anchoring group at terminus of the polymer chain and a plurality of surface anchoring groups on the main chain.

In seventh example, for any one of the first through sixth examples, wherein the side chain includes a photo-acid generator including a polymer.

In eighth example, for any one of the first through seventh examples, the polymer is a homopolymer.

In ninth example, for any one of the first through eighth examples, the side chain polymer includes:

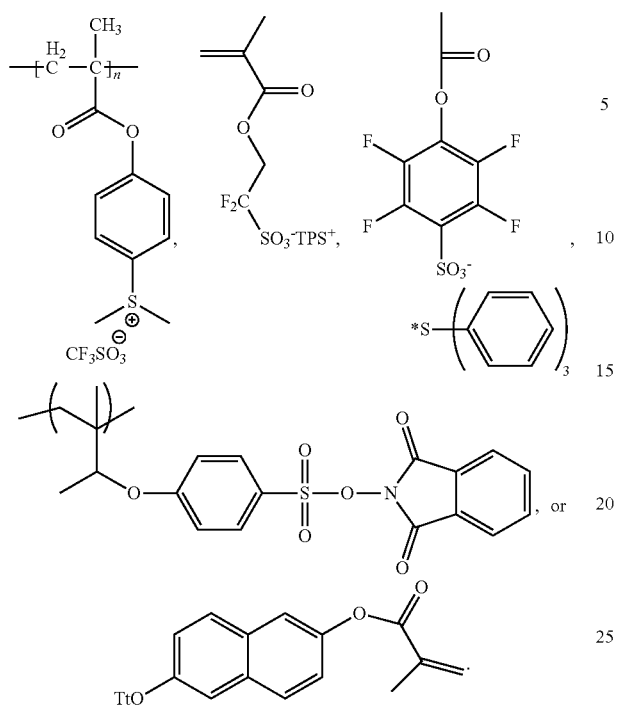

In tenth example, for any one of the first through ninth examples, the side chain is a quencher and includes one of 2-Vinyl Pyridine, 4-Vinyl Pyridine, 2-(Dimethylamino)ethyl methacrylate, 2-(Dimethylamino)ethyl acrylate, 2-propenenitrile, carboxylic/benzoic acids, N,N-dimethylacrylamide, or N-ethyl pyrrolidine methacrylamide.

In eleventh example, for any one of the first through tenth examples, the side chain is a catalyst.

In twelfth examples, a chemical composition, includes an EUV scissionable main polymer chain and a surface anchoring group attached to a terminus of the main polymer chain.

In thirteenth example, for any one of the twelfth examples, the surface anchoring group includes hydroxyl (—OH), carboxy (—COOH) groups, aminosilane, chlorosilane, or alkoxysilane.

In a fourteenth example, for any of the twelfth through thirteenth examples, the chain scission polymer is a plurality of acrylate-based monomers having the structural formula:

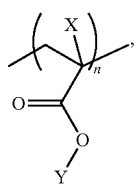

wherein X is a halide group, a tosylate group, a triflate group, a triflimide group or a $C_XF_Y$ molecule and
wherein Y is a methyl, ethyl, propyl, isopropyl, tert-butyl, cyclohexyl or a silyl group.

In fifteenth example, for any one of the twelfth through fourteenth examples, the chain scission polymer is a copolymer having the structural formula:

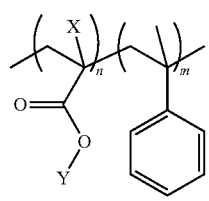

wherein X is a halide group, a tosylate group, a triflate group, a triflimide group or a $C_XF_Y$ molecule;
wherein Y is a methyl, ethyl, propyl, isopropyl, tert-butyl, cyclohexyl or a silyl group; and
wherein Z is a phenyl, benzyl, alkyl, alkoxy, alkoxy, amino or a hydroxyl group, and wherein p is an integer from 1 to 5.

In sixteenth example, for any one of the twelfth through fifteenth examples, the main polymer chain is a block copolymer chain, and wherein one block is chain scissionable.

In seventeenth examples, a chemical composition includes a first main chain including a hydrophobic polymer, a first surface anchoring group attached to the first main chain, a second main chain including a hydrophilic polymer and a second surface anchoring group attached to the second main chain.

In eighteenth example, for any one of the seventeenth examples, the first surface anchoring group and the second anchoring group each include a hydroxyl (—OH) or a carboxy (—COOH).

In nineteenth examples, for any one of the seventeenth through eighteenth examples, the hydrophobic polymer includes the structural formula:

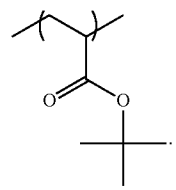

In twentieth examples, for any one of the seventeenth through nineteenth examples, the hydrophilic polymer incudes the structural formula:

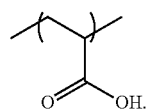

What is claimed is:

1. A chemical composition comprising:
a polymer chain comprising a surface anchoring group at a terminus of the polymer chain, wherein the surface anchoring group comprises alkoxysilanes, aminosilanes, or chlorosilanes, or mono-, di- and tri-substituted groups of alkoxysilanes, aminosilanes, or chlorosilanes, and wherein the polymer chain further comprises a photo-acid generator.

2. The chemical composition of claim 1, wherein the polymer chain comprises a main chain and one or more side polymer chains off the main chain, and wherein the side polymer chains include the photo-acid generator.

3. The chemical composition of claim 1, wherein the main chain includes one of the surface anchoring groups at terminus of the main chain and a plurality of the surface anchoring groups along a first length of the main chain proximal to the terminus and wherein repeat units including the photo-acid generator are along a second length of the main chain distal from the terminus.

4. The chemical composition of claim 2, wherein an individual one of the side polymer chains comprises a plurality of repeat units, each repeat unit including the photo-acid generator.

5. The chemical composition of claim 4, wherein the side polymer chain comprises:

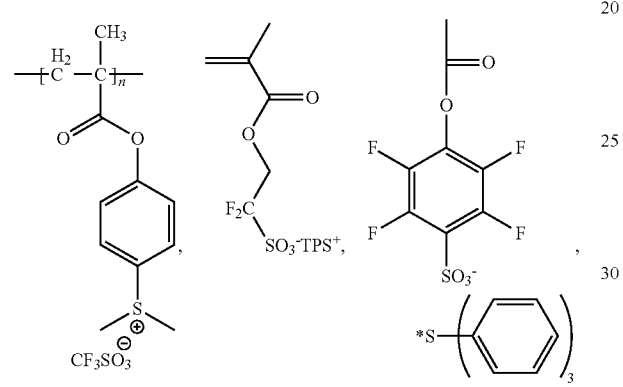

6. The chemical composition of claim 1, wherein the photo-acid generator comprises

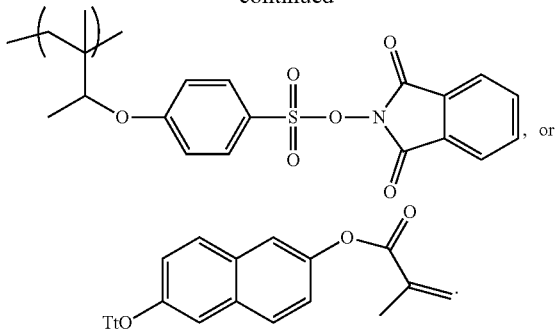

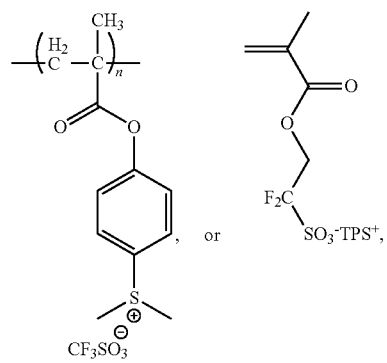

* * * * *